United States Patent [19]

Gifford et al.

[11] Patent Number: 5,347,460
[45] Date of Patent: Sep. 13, 1994

[54] METHOD AND SYSTEM EMPLOYING OPTICAL EMISSION SPECTROSCOPY FOR MONITORING AND CONTROLLING SEMICONDUCTOR FABRICATION

[75] Inventors: George G. Gifford, Bethel, Conn.; Brock E. Osborn, Hyde Park, N.Y.

[73] Assignee: International Business Machines Corporation, Armonk, N.Y.

[21] Appl. No.: 935,076

[22] Filed: Aug. 25, 1992

[51] Int. Cl.$^5$ .................. G06F 15/46; C23C 14/00
[52] U.S. Cl. ................... 364/468; 364/498; 364/550; 204/192.33; 204/298.32
[58] Field of Search ............ 364/468, 498, 552, 550; 156/626, 643; 204/192.33, 298.32; 437/129

[56] References Cited

U.S. PATENT DOCUMENTS

| | | | |
|---|---|---|---|
| 4,365,303 | 12/1982 | Hannah et al. | 364/498 |
| 4,493,745 | 1/1985 | Chen et al. | 156/626 |
| 4,676,868 | 6/1987 | Riley et al. | 156/643 |
| 5,014,217 | 5/1991 | Savage | 364/498 |
| 5,059,552 | 10/1991 | Harder et al. | 437/129 |

FOREIGN PATENT DOCUMENTS 0153901  1/1985  European Pat. Off. .

OTHER PUBLICATIONS

J. Besag, "Spacial Interaction and the Statistical Analysis of Lattice Systems," J. Royal Statistical Soc., 36, pp. 192-236, 1974.

A. P. Dempster, N. M. Laird and D. B. Rubin, "Maximum Likelihood from Incomplete Data via the EM Algorithm," J. Royal Statistical Soc., 39, pp. 1-38, 1976.

S. Geman and D. Geman, "Stochastic Relaxation, Gibbs Distributions, and the Bayesian Restoration of Images," IEEE Transactions on Pattern Analysis and Machine Intelligence, vol. PAMI-6, No. 6, pp. 721-741, 1984.

U. Grenander, "Tutorial in Pattern Theory," Division of Applied Mathematics, Brown University, Providence, R.I., Chapter 4, pp. 44-99, 1983.

U. Grenander, "Advances in Pattern Theory, The Rietz Lecture 1985," Division of Applied Mathematics, Brown University, pp. 1-45, 1985.

D. W. Hosmer, Jr., and S. Lemeshow, *Applied Logistic Regression*, A Wiley-Interscience Publication, John Wiley & Sons, p. 6, 1989.

B. Osborne, "The Identification and Estimation of Parameters in Patter Theoretical Models," IBM Technical Report (TR 00.3608), IBM Poughkeepsie, N.Y., pp. 1-25, Mar. 1991.

R. W. B. Pearse and A. G. Gaydon, *The Identification of Molecular Spectra*, Fourth Edition, Imperial College, London, Chapman and Hall, pp. 217-219, 1976.

A. R. Striganov and N. S. Sventitskii, *Tables of Spectral Lines of Neutral and Ionized Atoms*, Atomic Spectroscopy Laboratory, I. V. Kurchatov Institute of Atomic Energy (Translated from Russian), IFI/Plenum, New York-Washington, pp. ix, x, 141-144 and 328, 1968.

(List continued on next page.)

*Primary Examiner*—Jerry Smith
*Assistant Examiner*—Jim Trammell
*Attorney, Agent, or Firm*—Lawrence D. Cutter; Kevin P. Radigan; Jeff Rothenberg

[57] ABSTRACT

Automated, closed loop method and system for monitor and control of semiconductor fabrication processing are described. Optical emissions spectrometer (OES) data readings from a fabrication plasma chamber are statistically analyzed and a novel pattern model (based on Markov random fields) is used in combination with a selective stochastic relaxation technique to identify gaseous species within the chamber from the OES readings. Wavelength and intensity information is also employed to accurately estimate relative concentration levels of identified gases within the chamber. The unique statistical analysis approach described allows real-time monitor and control of physical processing within the fabrication chamber. Several practical algorithms are set forth, including techniques for OES peak identification, peak sharpening, gas identification, and physical processing control.

40 Claims, 16 Drawing Sheets

OTHER PUBLICATIONS

G. G. Gifford, "Applications of optical emission spectroscopy in plasma manufacturing systems," SPIE vol. 1392 Advanced Techniques for Integrated Circuit Processing, pp. 454–465, 1990.

K. Fukunaga, *Introduction to Statistical Pattern Recognition*, Second Edition, Academic Press, Inc., pp. 51–59, 1990.

R. O. Duda and P. E. Hart, *Pattern Classification and Scene Analysis*, John Wiley & Sons, Inc., Chapter 2, pp. 10–22, 1973.

"OMA Vision ODA, Process Vision, Spectra Vision, ColorVision, Spectroscopy Software," brochure, EG&G Princeton Applied Research (1990), SC Technology Inc., 2–9.

"PCM Plasma Chemistry Monitor," brochure, SC Technology, Inc. (1990).

METHOD AND SYSTEM EMPLOYING OPTICAL EMISSION SPECTROSCOPY FOR MONITORING AND CONTROLLING SEMICONDUCTOR FABRICATION

TECHNICAL FIELD

The present invention relates in general to semiconductor fabrication, and more particularly, to an automated, closed loop method and system for monitoring and controlling semiconductor processing within a fabrication chamber using real-time statistical analysis of sensed data representative of gaseous species present in the chamber at a given point in time.

BACKGROUND ART

The quality of a semiconductor is directly dependent on the consistency of the fabrication process by which it is created. Specifically, production of state-of-the-art semiconductor components requires reproducible plasma processes for etching and deposition. Controls on chemical composition and impurity levels within the fabrication chamber are crucial to the success of these processes, particularly at today's increasingly high levels of circuit density.

Certain analytical techniques have been demonstrated as potential monitors of chemical species in a plasma process. These techniques include optical emission spectroscopy (OES), fourier transform infrared spectroscopy (FTIR), and laser induced fluorescence (LIF). Each technique offers unique information about a processing environment. However, each of these analytical approaches characterizes gaseous species by determining an intensity for one or more electromagnetic wavelengths occurring at the same point in time within the plasma chamber.

In the specific inventive embodiments of semiconductor fabrication described herein, an optical emission spectrometer (OES) is utilized as the sensor of choice. An OES is a commercially available device which is used to detect the presence and relative concentrations of various gases in a plasma chamber. This spectrometer works by detecting light emitted from electron transitions occurring in atoms and molecules within the chamber. Currently, optical emission spectrometers are used in open-ended processing whereby an expert attempts to characterize the chemistry of a plasma environment during wafer manufacturing, e.g., to identify a processing end-point based on the resultant data. Existing OES processing is discussed further herein below. Also, additional information thereon is available in an article by G. Gifford, entitled "Applications of Optical Emissions Spectroscopy in Plasma Manufacturing Systems," SPIE Microelectronic Integrated Processing Symposium (1990).

It is important to note that currently each of the above-listed spectroscopic techniques for possible use in semiconductor manufacturing requires an expert to analyze an initial spectra and to train manufacturing personnel in the meaning of the spectra and that of deviations from base line spectra measurements. Such an inherently subjective method of analysis can often be inadequate due to the complexity of the spectra involved. Also, these open-ended analysis techniques cannot be used to effectively execute real-time monitoring and control of the manufacturing process. In fact, there are few real-time, closed loop monitoring and control methods/systems presently employed in the semiconductor manufacturing environment.

Thus, to summarize, there is a need in the art for a more effective technique for monitoring and controlling semiconductor fabrication. The present invention addresses this deficiency by providing an automated, closed loop, real-time method and system for monitoring and controlling semiconductor fabrication processing within a plasma chamber.

DISCLOSURE OF THE INVENTION

Briefly summarized, the present invention comprises in one aspect an automated method for monitoring and controlling, within predefined limits or derived limits, a semiconductor manufacturing apparatus having a fabrication chamber. The chamber includes at least one flow rate controllable gaseous species inlet, an adjustable radio frequency powering mechanism, or a pressure adjustment mechanism, for feedback control of a plasma process occurring therein. This automated method broadly includes the steps of: operating the semiconductor manufacturing apparatus to produce a plasma process within the fabrication chamber; collecting from within the chamber wavelength and intensity data on a plurality of different electromagnetic wavelengths simultaneously occurring therein; determining an intensity peak location for at least some of the simultaneously occurring electromagnetic wavelengths using the wavelength and relative intensity data; identifying in an automated manner at least one gaseous species contained within the chamber during plasma processing utilizing at least some of the collected wavelength data and determined peak location information; and automatically regulating plasma processing within the semiconductor fabrication chamber based on the above-determined gaseous species information. The regulating step includes controlling the at least one flow rate controllable gaseous species chamber inlet, adjustable radio frequency powering means or pressure adjustment mechanism to ensure plasma processing within said predefined or derived limits. Regulation is based upon the collected wavelength data, determined peak location information and identified gaseous species.

Numerous detailed enhancements to the basic method are also described herein. In particular, a model is preferably established based on Markov random fields for a preselected plurality of possible gaseous species to occur within the fabrication chamber. The Markov random field based model is solved using a maximization algorithm, and preferably using a selective stochastic relaxation approach described herein. In an alternative aspect, the method of the present invention can be thought of as comprising a novel closed loop semiconductor manufacturing method including automated, real-time control of plasma processing occurring within the fabrication chamber.

In another aspect of the present invention, a closed loop system for manufacturing a semiconductor is set forth. The closed loop system includes semiconductor manufacturing apparatus having a fabrication chamber and generating means for establishing plasma processing therein, e.g., for semiconductor etching or deposition. At least one adjustable mechanism is provided for feedback control of the plasma process within the fabrication chamber. Collection means is associated with the chamber for collecting an electromagnetic wavelength spectra from the chamber during plasma processing. The collected spectra comprises wavelength data and intensity information. Means for determining an intensity peak location for at least one of the different wavelengths in the wavelength data is also provided. A processor is programmed to automatically identify at least one vaporized species contained within the chamber during plasma processing utilizing the wavelength data and intensity peak location information. Lastly, a real-time feedback control mechanism, responsive to the processor, is provided for regulating within predefined or derived limits the plasma process within the chamber based on at least some of the collected wavelength data, intensity peak location information and identified vaporized species. (Alternatively, the temporal variance of the identified species can be used to control the system.) Feedback control is obtained by controlling the at least one adjustable plasma processing mechanism associated with the fabrication chamber. Further specific details of this system, as well as alternate aspects of the system, are also described herein.

To summarize, a novel closed loop method and system for monitoring and controlling semiconductor processing within a fabrication chamber are provided. The method and system utilize real-time statistical analysis of sensed data representative of gaseous species present in the plasma chamber at a given point in time. In the embodiment described, an optical emission spectrometer is used to obtain intensity readings as a function of wavelength. Statistical analysis involves creating a novel pattern model based on Markov random fields, which is then solved using selective stochastic relaxation analysis to identify gaseous species within the chamber. The monitor and control technique is fully objective, being fully automated, and allows for real-time control of physical processes occurring within the chamber. The approach ensures process uniformity and thereby improves product quality. Although described with reference to OES data, the algorithms and approach presented are applicable to other types of spectroscopic devices as well.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

The initial portion of this discussion examines certain novel methods of statistical analysis used for interpreting data from an optical emission spectrometer (OES). (Again, an OES is selected herein for the detection of the presence and relative concentration of gases in a processing chamber.) Thereafter, a hardware implementation of a closed loop system pursuant to the present invention is described, along with monitoring and control processes for use in connection therewith. The discussion presented herein is provided by way of example only and those skilled in the art will recognize that various modifications and substitutions to the structures and methods described can be made without departing from the scope of the present invention as defined by the claims appended hereto.

Two statistical models are introduced for solving the problem of using OES data to determine which gases are present at a particular point in time within a fabrication chamber. The first is a simple pattern matching scheme which employs a table look-up procedure. Although this technique can be effective, it becomes unwieldy if a large number of gases are under consideration. Next Bayesian statistics is introduced to take into account statistical uncertainty inherent to the problem. In this framework, a pattern theoretical model which has been determined to work well is described based on the concept of Markov random fields.

The emphasis in this initial statistical description is on the development of practical algorithms rather than on theory. Techniques for OES peak identification, peak sharpening, and gas identification are subsequently described in detail in connection with the flowcharts of the accompanying drawings. The development of the models is motivated by an understanding of the physics of the problem at hand and parameters are assigned accordingly.

As noted initially, an OES works by detecting the light that is emitted from electron transitions occurring within atoms and molecules, and particularly, gaseous or vaporized atoms and molecules. Optical emission spectrometers are used to characterize the chemistry of the plasma environment during wafer manufacturing in order to ensure process reproducibility and quality. Further details of optical emission spectroscopy are provided in the above-referenced G. Gifford article.

Figure 1:
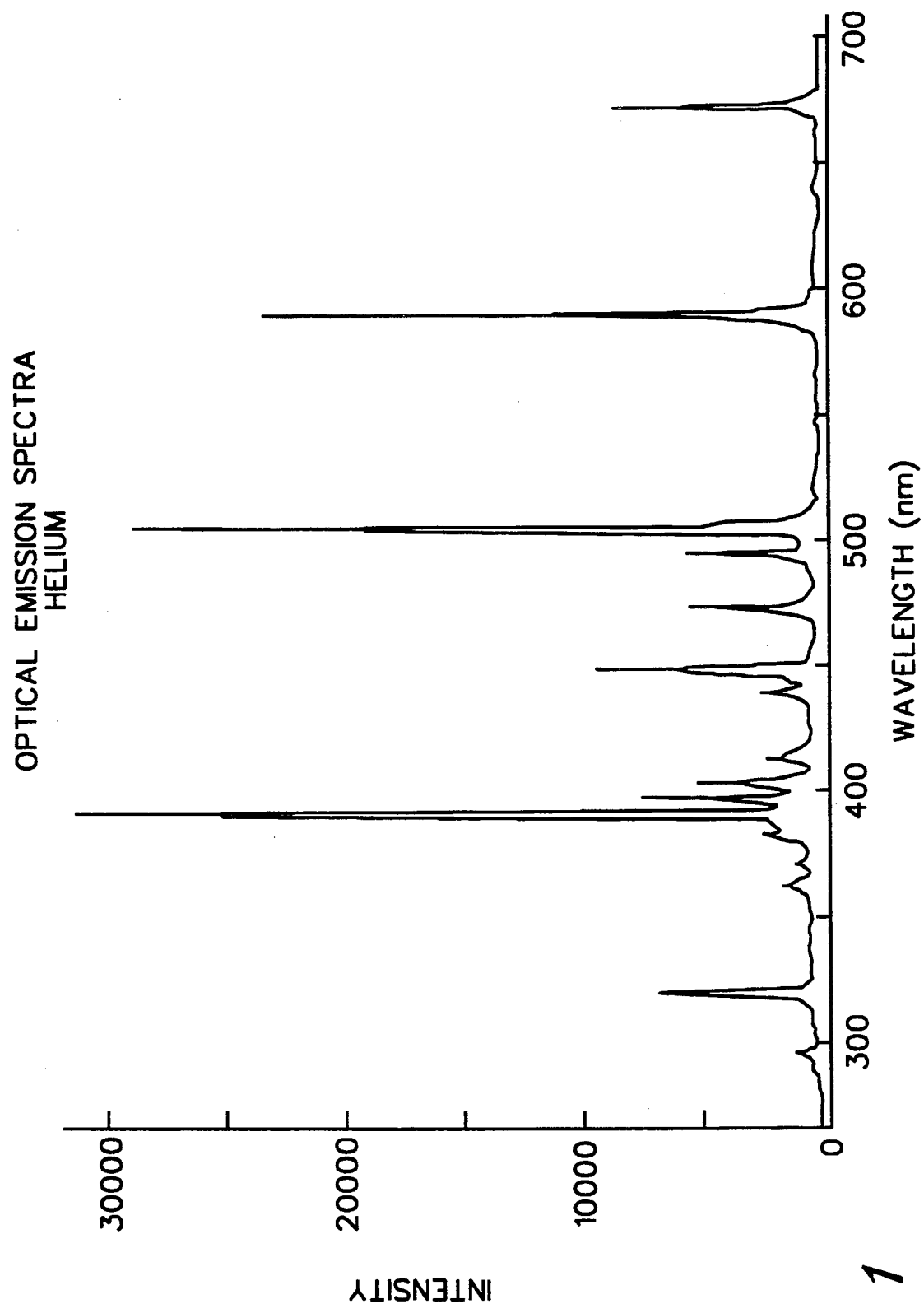
FIG. 1 is hand drawn representation of a graph of an optical emission spectra for helium.

A hand drawn example of an optical emission spectra for helium is shown in FIG. 1, which is simply a graph of intensity of energy emissions vs. measured wavelengths.

An OES measures light emission at specific wavelengths. Adjacent wavelengths can be acquired through either a series of multiple diodes, e.g. 512 or 1024 diodes or a single diode where light of multiple adjacent wavelengths are sequentially exposed to a single detector or diode as with a scanning monochromator. Hence, an important characterization of OES devices is their level of wavelength resolution. FIG. 1 is an example of a low resolution (LR) OES where readings are taken at approximately every 0.6 nm. OES devices can measure at much finer resolutions, but this requires a longer time to cover the same range of wavelengths, which eventually limits their practical use for real time applications. Readings taken at a resolution worse than 1.0 nms provide a coarse spectrum that makes species identification difficult for an expert, as well as for an automated routine.

Tables are available in the open literature which indicate where peaks for a particular gas should appear and the approximate relative intensities of these peaks. A portion of such a table for helium is reproduced in Table 1 (See J. Reader and C. Corliss, "Line Spectra of the Elements", CRC Handbook of Chemistry and Physics (1983)).

TABLE 1

Sample OES Peaks for Helium

| Wavelength (nm) | Relative Intensity |
|---|---|
| 388.865 | 500 |
| 396.4729 | 20 |
| 402.6191 | 50 |
| 447.1479 | 200 |
| 501.5678 | 100 |
| 587.562 | 500 |
| 587.597 | 100 |
| 667.815 | 100 |

The statistical problem presented is to identify the gases that are present in the chamber at a particular point in time given measured OES data. Building of a statistical model is discussed below, starting simply and adding complexity as it becomes necessary to solve the problem. Again, emphasis is on developing practical techniques rather than abstract theory. In many cases specific algorithms are provided to make the analysis concrete.

SELECTING A STOCHASTIC MODEL

Identifying the Peaks

The first step is to determine the wavelengths at which the peaks appear in the graph. Once these wavelengths are known, an initial attempt can be made to identify which gases are present through a table look-up procedure.

The OES data can be thought of as consisting of a set of ordered pairs, $\Gamma_i = (\lambda_i, I_i)$, where $\lambda$ is the wavelength and I is the corresponding intensity level at that wavelength. The graph in FIG. 1 consists of 700 points (i.e., "i" ranges from 1 to 700), with $\Gamma_i$ being provided at about every 0.6 nm.

First, the $\Gamma_i$ are reordered so that they are in descending order of intensity, i.e.: $I_1 \geq I_2 \geq \ldots \geq I_N$. Next, the $\Gamma_i$'s are grouped together in the following manner:

1. Start the first group with $\Gamma_1$;
2. Set "i"=2;
3. If $\lambda_i$ is one greater or one less than one of the $\lambda$'s in any existing group, then put $\Gamma_i$ into that (or those) groups(s) (Otherwise, create a new group starting with $\Gamma_i$);
4. Set "i"="i"+1; and
5. If "i"$\leq$N then go to 3 above. (Otherwise, stop.) (The process is described in greater detail herein with reference to FIG. 10.) Once this process is complete K groups will be defined corresponding to the K peaks in the graph. The wavelength and intensity of each peak is given by the $\Gamma_i$ that started each group. Note that the peaks (if they exist) at the end points of the graph (i.e., the smallest and largest wavelengths) should be disregarded because data is typically truncated at those points.

Peak Sharpening

The above-outlined procedure for identifying the wavelength of each peak in a graph is limited by the level of resolution of (LR) OES being used. In the case presented, readings were obtained every 0.6 nm, and hence a peak identified to be at, for example, 396.3 nm could actually be somewhere between 396.0 and 396.6 nm. The accuracy of the estimation of the wavelength can be improved through an extrapolation procedure which is referred to herein as peak sharpening.

Figure 2:
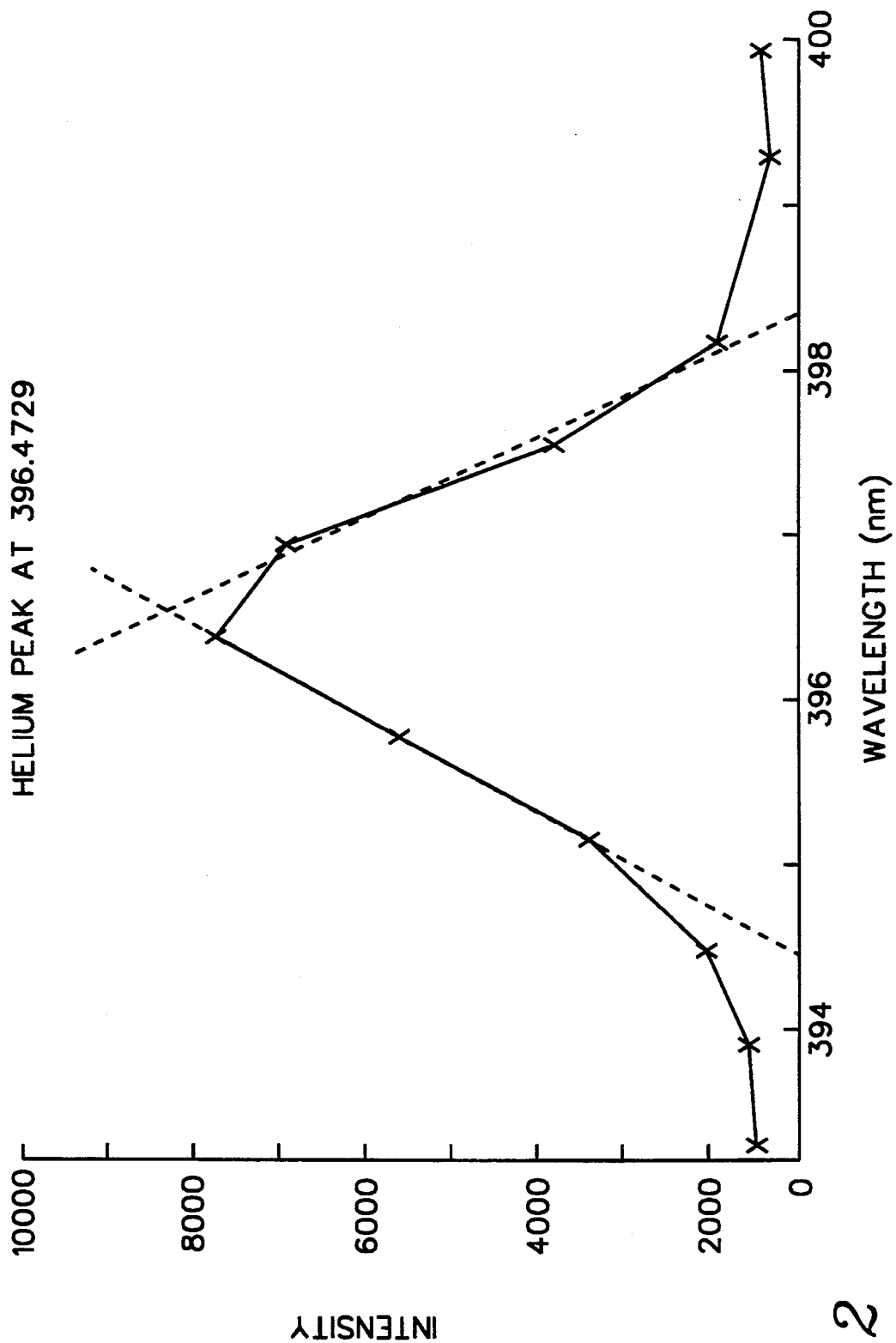
FIG. 2 is a graph of a magnified portion of the optical emission spectra of FIG. 1 useful in explaining "peak sharpening" pursuant to the present invention.

FIG. 2 shows an enlargement of a particular peak in the helium plot of FIG. 1. This peak appears at approximately 396.3 nm. Two regression lines (shown as dotted lines) have been fitted thereto using three points on either side of the peak to define a sharpened peak at 396.5 nm, which corresponds more closely to the actual location of the peak (according to Table 1) of 396.4729 nm. If the intensity of the peak had been larger, more points could have been used on either side to increase the accuracy.

A simple identification technique, which in practice gives inadequate results, will next be described.

Table Look-Up Procedure

Figure 3:
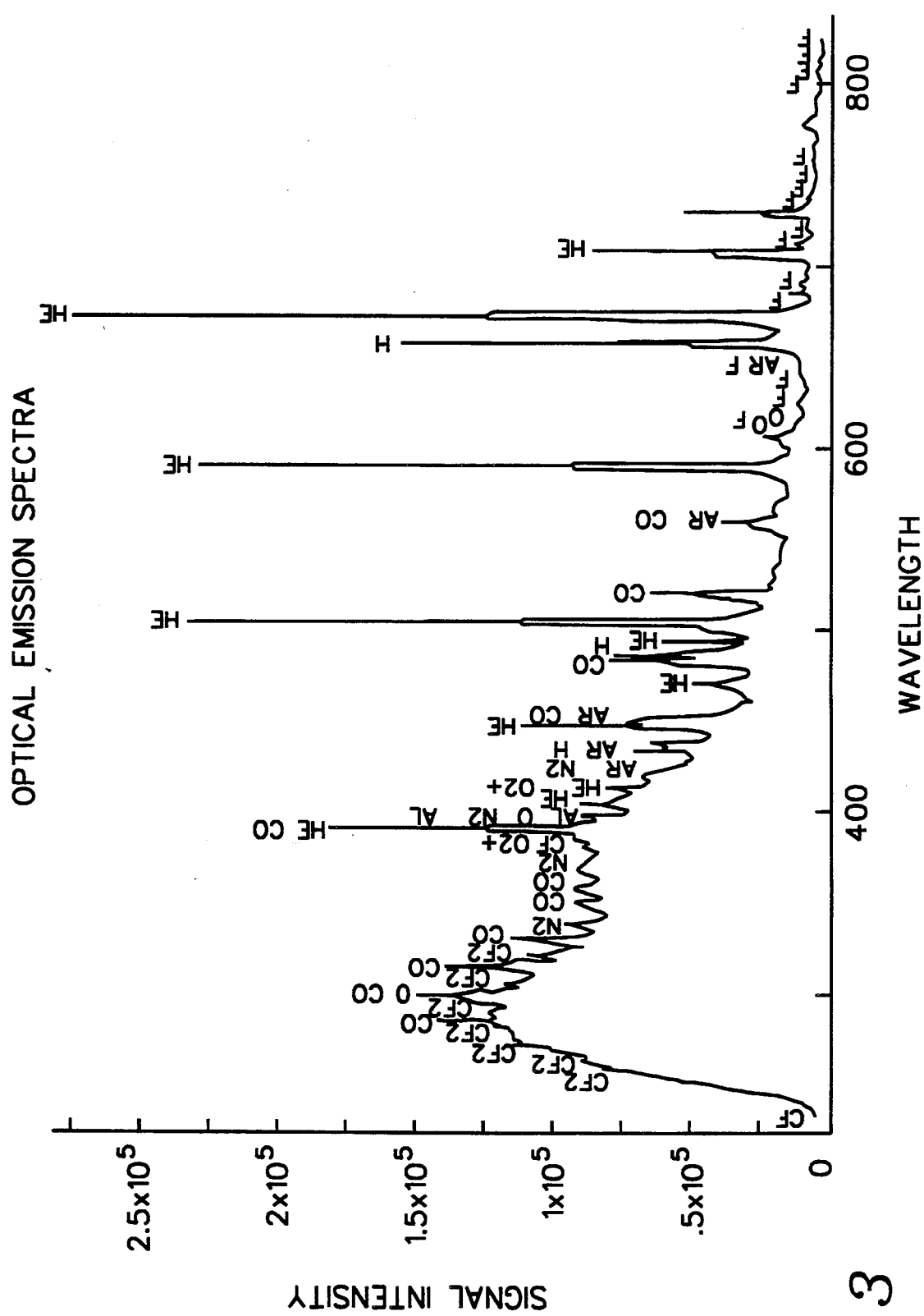
FIG. 3 is hand drawn representation of a graph of an optical emission spectra for a sample plurality of assembled gaseous species.

Once the peaks have been identified and sharpened, a simple table look-up procedure can be used to determine which gases are present. For each peak a search is made into a predefined table of known wavelengths for specific gases. For example, all table entries which are within 0.4 nm of the identified peak are arbitrarily considered to be possible candidates. FIG. 3 shows an example of applying this technique to the reactive ion etching (RIE) plasma $CF_4/CHF_3/He$. The table used for this example is limited to 12 gases with a total of 162 wavelengths. A much more extensive table would be required to do a more accurate job.

Even with this limited example, however, it is easy to see the difficulties that arise with this procedure. Each peak in the graph may be associated with multiple gases. If a more complete table were used, for example one consisting of several thousand wavelengths from perhaps a few hundred gases, the multiple assignment problem would be even more extensive. It is clear, therefore, that a more comprehensive model is needed.

The Bayesian Pattern Recognizer

One of shortcomings of the above model is that it fails to take into consideration two important pieces of information that an expert would traditionally use in the subjective process of interpreting OES data. The first is the relative intensity values in the table, and the second is the a priori likelihood that certain gases are present. The importance of the first piece of information is obvious. It is much more likely that a peak will be observed with a relative intensity of 500 than one with a relative intensity of 50. This should help in identifying multiple assigned peaks.

The existence of a priori likelihoods or probabilities is an advantage of OES analysis over other types of pattern recognition problems. If an OES spectra for a plasma process is being examined, there is very little likelihood that certain elements are present (no matter how close a peak in the graph is to a table wavelength value for this element). On the other hand, it would be surprising not to find elements such as oxygen, helium, silicon, etc. in semiconductor processes. A well designed pattern recognizer should, therefore, take these a priori probabilities and update them, i.e., produce a posteriori probabilities based on an observed OES spectra.

A powerful pattern recognition technique that will fold in these two pieces of information is the Bayesian classifier. Consider a gas $G_1$ which has associated with it m table entries. Let $G_1=1$ indicate that the gas is present, and let $G_1=0$ indicate that the gas is absent. Similarly let $p_j=1$ or 0 be used to indicate whether the $j^{th}$ table entry for the gas is present or absent in the graph. Begin by assuming that a perfect high resolution OES is available in which a peak in the graph corresponds exactly to the appropriate table entry value. Later this assumption will be relaxed and the actual situation of a low resolution OES will be considered. From Bayes theorem:

$$P[G_i|p_1, p_2, \ldots p_m] = \frac{1}{Z} P[p_1, p_2, \ldots p_m|G_i] \times P[G_i] \quad (1)$$

where:

P[.|.]—indicates conditional probability,
$P[G_i]$—is the a priori probability that the gas is present or absent,
Z—is the normalization constant.

The conditional probability that certain peaks will be present in the graph given that the gas is present depends on the relative intensities in the look-up table. An appropriate assumption is that:

$$P[p_1, p_2, \ldots p_m|G_i] = P[p_1|G_i] \times P[p_2|G_i] \times \ldots \times P[p_m|G_i] \quad (2)$$

where each $P[p_j|G_i=1]$ is some function of the relative intensity for table entry j. The conditional probability that a particular peak would be observed if no gas is present (i.e., $P[p_j=1|G_i=0]$) is some small constant based on the noise present in the system. The specific value of this function and constant could be determined by using maximum likelihood or similar parameter estimation techniques on a set of learning data where the gases are known to be present or absent.

Once the parameters have been estimated and an unknown mixture has been sampled, the Bayesian classifier dictates that the gas in question is present if:

$$P[G_i=1|p_1,p_2,\ldots,p_m] > P[G_i=0|p_1,p_2,\ldots,p_m] \quad (3a)$$

Combining equations (1) and (2), it is found that equation (3a) is equivalent to deciding that the gas is present if:

$$P[p_1|G_i = 1] \times P[p_2|G_i = 1] \times \ldots \times \quad (3b)$$
$$P[p_m|G_i = 1] \times P[G_i = 1] > P[p_1|G_i = 0] \times$$
$$P[p_2|G_i = 0] \times \ldots \times P[p_m|G_i = 0] \times P[G_i = 0]$$

The Pattern Theory Model—Extension of Bayesian Pattern Recognizer:

The above model is appropriate if a perfect high resolution OES was available where each peak could be viewed at its exact wavelength. Of course in reality this is not the case. If the peak associated with the $j^{th}$ table entry were present in the graph, it would be observed at some different wavelength than the one listed. This difference would depend on the level of resolution of the OES, the error involved in the peak sharpening algorithm, and the accuracy of the instrument calibration procedure. In addition, other gases in the system will affect which peaks of the gas under study will be observed. These effects relate to the physics of the OES process, and it would be difficult (if not impossible) to take into consideration all of the complexities involved. However, there is a lot which can be considered to make the model more realistic and accurate.

From a statistical point of view, the issues raised in the preceding paragraph can be summarized by saying that the values $p_1, p_2, \ldots, p_m$ cannot be observed directly. Instead the peaks in the graph represent some deformed image of these values. For simplicity two types of deformation mechanisms that alter the view of the $p_j$'s are considered.

1. A simple shift in the wavelength. For example, if $p_j=1$ then instead of observing the peak at its true wavelength it is observed at another wavelength.
2. A blurring effect in which two distinct peaks at wavelengths $\lambda_1$ and $\lambda_2$ are observed as a single peak at wavelength $\alpha$.

Figure 4:
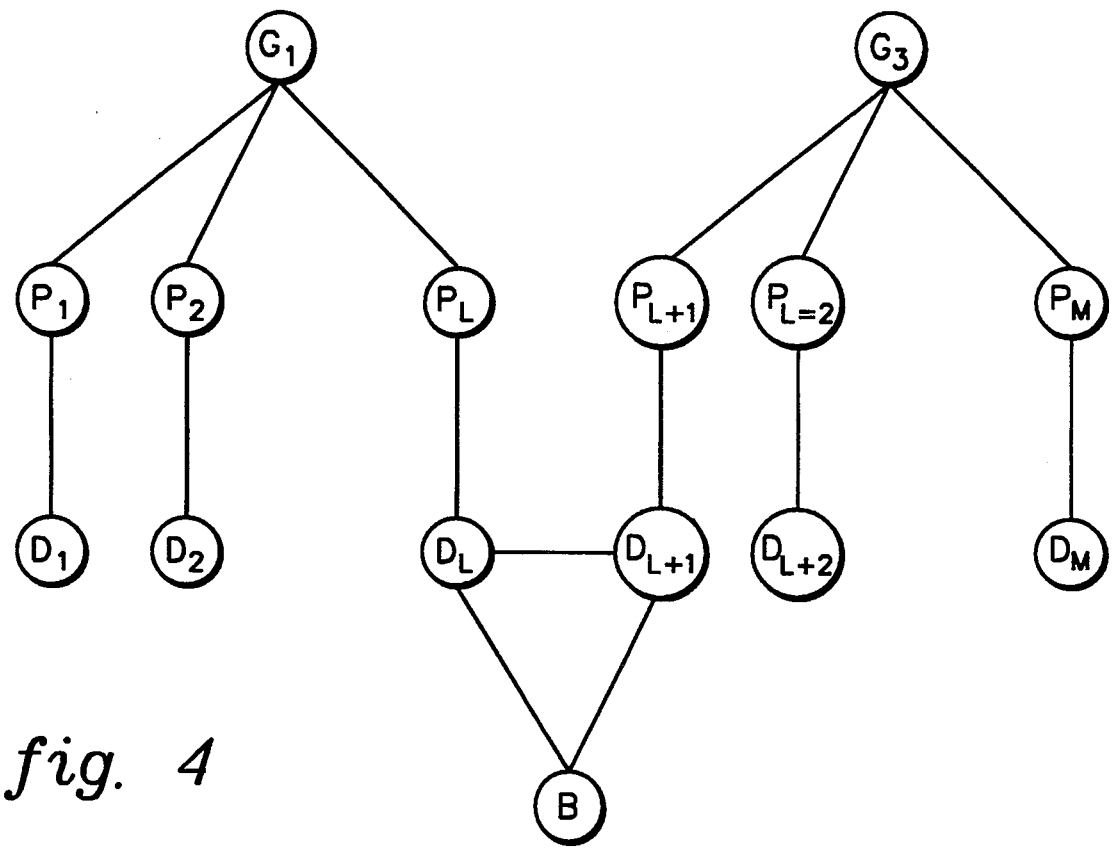
FIG. 4 is a diagram of a sample connector structure useful in describing the Markov random field model.

A model which takes all of the above (including equations (1)-(3b))—into consideration is represented graphically in FIG. 4. This is an example of a pattern theory model whose general structure was first formulated by U. Grenander, "Lectures in Pattern Theory," Vols. I, II & III, Springer-Verlag, New York (1976, 1978, 1981).

The circles in FIG. 4 are referred to as sites and the lines connecting the circles are referred to as segments. There are four levels of sites displayed. At the top level are the sites associated with the gases that may exist in the mixture under study (here only two gases have been displayed for simplicity). These sites will contain a "0" or a "1" depending on the values of the $G_i$'s. The second level contains sites associated with the $p_j$'s which will also take values from the set {0,1}. The third level consists of sites which contain the 'shifted' wavelength from the distortion mechanism (1) described above. Finally, the fourth level consists of sites which contain the 'blurred' wavelength that resulted from distortion mechanism (2). (The third and fourth levels are to comprise real numbers.) Note that this blurring deformation only occurs if the wavelengths of the corresponding peaks are close enough together. In the example presented, the $L^{th}$ table entry associated with gas 1 is close to the wavelength for the $L+1^{st}$ table entry associated with gas 2.

When OES data (such as that displayed in FIG. 3) is examined, only sites $D_1, D_2, \ldots D_{L-1}, D_{L+2}, \ldots D_M$ and site B can be observed. Sites $D_L$ from gas 1 and $D_{L+1}$ from gas 2 are hidden due to the blurring deformation, and all of the G sites and all of the p sites are hidden due to the shift in wavelength deformation. The statistical problem is to determine the $G_i$'s and the $p_i$'s.

As one might expect, the segments in the graph represent relationships between the sites. More precisely the segments indicate the conditional probabilities inherent in the pattern theory model. Specifically, the conditional probability of the value of any site given the values of all of the other sites in the graph is equal to the conditional probability of the value of the site given the values of just those sites which are directly connected to the subject site. For example, considering the site $p_1$ which is connected to the sites $G_1$ and $D_1$:

$$P[p_1 | \text{all other sites in the graph}] = P[p_1 | G_1, D_1]$$

This is called the Markovian relationship, and mathematical structures which possess such a relationship are called Markov random fields (e.g., see S. Geman and D. Geman "Stochastic Relaxation, Gibbs Distributions and the Bayesian Restoration of Images," IEEE PAMI-6, 721–741 (1984)).

CONSTRUCTION OF THE PATTERN MODEL

The general probability measure for pattern models is described in U. Grenander, "The Reitz Lecture 1985: Advances in Pattern Theory," Annals of Statistics, 17, pp. 1–30 (1989). In the example depicted herein, the probability density function for the model of FIG. 4 with N gases, $M_i$ table entries for gas "i", and S 'B' sites is given by:

$$P[G_1, \ldots, G_N, p_1, \ldots, p_{MN}, D_1, \ldots, D_{MN}, B_1 \ldots, B_S] = \qquad (4)$$

$$\frac{1}{Z} \prod_{i=1}^{N} \prod_{j=M_{i-1}+1}^{M_i} A_{ji}(p_j, G_i) \times \prod_{j=1}^{M_N} H(p_j, D_j) \times$$

$$\prod_{t=1}^{S} Q(D_{t1}, \ldots, D_{tk(t)}, B_j)$$

where sites $D_{t1}, \ldots D_{tk(t)}$ connect to site $B_t$, and $M_0 = 0$.

The functions $A(.,.)$, $H(.,.)$, $Q(., \ldots,.)$ are called acceptor functions, and the variables $G_1, \ldots, G_N, p_1, \ldots, p_{MN}, D_1, \ldots, D_{MN}, B_1, \ldots, B_S$ are referred to as generators which take values from some set of generator spaces (see above-referenced U. Grenander articles entitled "Lectures in Pattern Theory"). Generators are associated with the sites in the graph and acceptor functions are associated with the segments in the graph.

Equation (4) is an example of a partially homogeneous graph (see B. Osborn, "The Identification and Estimation of Parameters in Pattern Theoretical Models," IBM Technical Report (TR 00.3608), pp. 1–25 (1991)), with generators taking values from both binary and continuous generator spaces. The acceptor functions $A_{ji}(.,.)$ are associated with the heterogeneous region of the graph, and the acceptor functions $H(.,.)$ and $Q(., \ldots,.)$ are associated with the homogeneous regions of the graph.

Parameter Estimation

Now that the general structure of the model has been outlined, the following discussion focuses on the problem of parameter identification and estimation. The issues of identifiability for general pattern structures are addressed in the above-referenced B. Osborn IBM Technical Report and that theoretical development is employed herein for the present problem.

This same reference also describes the use of maximum likelihood, pseudolikelihood, and the method of local differences to estimate the parameters of general pattern structures. Any of these techniques would be suitable if sufficient data were available. Unfortunately, collecting enough data for this type of analysis is expensive and time consuming. Experiments would have to be designed to ensure that all combinations of gases were considered as part of the data gathering process.

In order to avoid these problems parameter estimation is attempted herein by examining the pieces of the model in detail and making use of an understanding of the physics of the problem involved. Subsequent discussion focuses on how these estimates can be improved.

The blurring distortion mechanism: Initially, consider the acceptor function $Q(., \ldots,.)$ which is associated with the blurring mechanism that takes into consideration that a peak that is observed in the graph may be the result of two or more table entry values. The specific structure of Q is somewhat arbitrary, but for simplicity consider the following single parameter expression:

$$Q(D_{t1}, \ldots, D_{tk}, B) = \begin{cases} = q & \text{if } \Lambda = B \\ = (1 - q) & \text{otherwise.} \end{cases} \qquad (5)$$

$$\text{Where: } \Lambda = \frac{\sum_{j=t_1}^{t_k} D_j \times I_j}{\sum_{j=t_1}^{t_k} I_j}$$

Here $I_j$ is the relative intensity of the of the $j^{th}$ table entry.

First consider what happens when $q=1$. Then, $Q(., \ldots,.)$ is only nonzero when B is a weighted average of values of the D sites connected to B, where the weights are the relative intensities. This is an example of rigid regularity (see above-referenced Grenander articles entitled "Lectures in Pattern Theory"), which allows certain patterns (i.e., certain configurations of the graph), and does not allow others. If the regularity is relaxed and q is allowed to take a value between 0 and 1, it is easy to verify that:

$$P[B = \Lambda | D_{t1}, \ldots, D_{tk}] = q \qquad (6)$$

Formally, the regularity should be relaxed, thereby allowing the possibility of all patterns, even if some are extremely unlikely (J. Besag refers to this as the positivity condition, "Spatial Interaction and the Statistical Analysis of Lattice Systems (w/discussion)", J. Royal Statistical Soc., 36, pp. 192–236 (1974)), and hence $0 < q < 1$. However it is advantageous to choose q to be close to 1 in order to ensure that B is almost always equal to the weighted average in equation (6).

The wavelength shift distortion mechanism:

Next consider the distortion mechanism $H(p_j, D_j)$. Recall that this represents a simple shift in wavelength, in that when $p_j = 1$, $D_j$ has some random value "close" to the wavelength recorded in the $j^{th}$ table entry, which is referred to herein as $\omega_j$. Formally $D_j$ takes on values in the neighborhood of $\omega_j$ or $D_j \in \{\omega_j - l, \omega_j + l\}$. Although l could conceivably have the value of $\infty$, for present purposes, only a finite region is considered and hence $l < \infty$. Finally, if no peak is present in the graph, it is assumed that $D_j = 0$, and hence:

$$D_j \in \{0, (\omega_j - l, \omega_j + l)\} \qquad (7)$$

Two questions then arise:
(1) What is the distribution of $D_j$?
(2) What is an appropriate value for l?

The answers will come from an understanding of the calibration process.

Before the OES can be used it must be calibrated. The OES is set to monitor a certain spectrum of wavelengths with a specific level of resolution, but monitoring of some known gas (such as helium, as in FIG. 1) must be performed in order to calibrate the wavelength position of the unit. Using the peak finding and peak sharpening algorithms described above, the best equation which translates the positions of the diodes of the OES into wavelengths can be determined through linear (or nonlinear) regression. As expected, the residual error has approximately a normal distribution with mean 0 and standard deviation $\sigma$. It is therefore reasonable to assume that $D_j$ should have a truncated normal distribution with similar characteristics.

In order to find an appropriate value for l, one should realize that it has two related purposes in the present model. First, through equation (7), l defines the region of interest, i.e., where the graph is examined for a peak, which should be close to $\omega_j$. Secondly, l defines where the normal distribution (described above) should be truncated.

To make things precise, the conditional probability density function of $D_j$ given $p_j$ can be defined as:

$$f[D_j = x | p_j = 1] = \begin{cases} \left( \dfrac{1}{\sqrt{2\pi\sigma}} \times \exp\left[ -\dfrac{(x - \omega_j)^2}{2\sigma^2} \right] \right) & \text{for } x \in \{\omega_j - l, \omega_j + l\} \\ \left( \dfrac{e^b}{1 + e^b} \right) & \text{for } x = 0 \end{cases} \quad (8)$$

Here $e^b/(1+e^b)$ is the probability that the peak in the graph will not be observed even though it should be present (i.e., $p_j=1$). This may be due to a number of reasons, the most likely of which is that it is outside of the defined region of interest, i.e. outside of $\{\omega_j - l, \omega_j + l\}$. If l is chosen to be $3 \times \sigma$, the probability that $D_j$ will fall outside of this region is 0.0026, and therefore $b = -5.95$.

Note that if l is less than the resolution of the graph, then each D site connects to at most one B site. This greatly simplifies the model.

Staying with $D_j$, consider its distribution when $p_j=0$. In this case $D_j$ would take on nonzero values if there were noise in the system. Furthermore, it is reasonable to assume that these nonzero values of $D_j$ would be uniformly distributed over the region of interest and hence this conditional probability density function can be written as:

$$f[D_j = x | p_j = 0] = \quad (9)$$

$$\begin{cases} \left( \dfrac{e^a}{2 \times l \times (1 + e^a)} \right) & \text{for } x \in \{\omega_j - l, \omega_j + l\} \\ \left( \dfrac{1}{1 + e^a} \right) & \text{for } x = 0 \end{cases}$$

If the noise level is assumed to be 10% then: $P[D_j \neq 0 | p_j=0]=0.1$, and therefore, $a = -2.197$.

With this information and the fact that $H(0,0)=1$ (see the above-referenced B. Osborn article) equation (4) can be used to verify that:

$$H(0, 0) = 1 \quad (10)$$

$$H(1, 0) = e^b$$

$$H(0, x) = \left( \dfrac{e^a}{2 \times l} \right) \quad \text{for } x \neq 0$$

$$H(1, x) = \left( \dfrac{1 + e^b}{\sqrt{2\pi\sigma}} \times \exp\left[ \dfrac{-(x - \omega_j)^2}{2 \times \sigma^2} \right] \right)$$

$$\text{for } x \neq 0$$

The heterogeneous acceptor function:

Turning now to the acceptor function $A_{ji}(.,.)$, the B. Osborn article states that in order to ensure identifiability two restrictions are necessary: $A_{ji}(0,0)=1$ and $A_{1i}(0,1)=1$. Therefore, there are two unknowns to determine for each i when $j=1$, and three unknowns for each i for all of the other values of j. Without loss of generality the following can be defined:

$$A_{ji}(0, 0) = 1 \quad (11)$$

$$A_{ji}(1, 0) = e^{\epsilon_j}$$

$$A_{ji}(0, 1) = \begin{cases} e^{\delta_i} & \text{if } j = 1 \\ 1 & \text{otherwise} \end{cases}$$

$$A_{ji}(1, 1) = \begin{cases} e^{\delta_i + \epsilon_j + f_j} & \text{if } j = 1 \\ e^{\epsilon_j + f_j} & \text{otherwise} \end{cases}$$

Although at first this structure may seem unnecessarily complex, consider the resulting conditional probability:

$$P[G_i = 1 | p_1, \ldots, p_{M_i}] = \dfrac{\left( \exp \delta_i + \sum\limits_{j=1}^{M_i} p_j \times f_j \right)}{\left( 1 + \exp \delta_i + \sum\limits_{j=1}^{M_i} p_j \times f_j \right)} \quad (12)$$

Note that the resultant form is one of logistic regression. Here, there is a term associated with the gas $(\delta_i)$ and a term $(f_j)$ associated with each peak that is present.

More insight into the meaning of $\epsilon_j$ and $f_j$ can be gained if the conditional probability $P[p_j | G_i]$ is considered:

$$P[p_j = 1 | G_i] =$$
$$= \int_{\{0, (\omega_j - l, \omega_j + l)\}} P[p_j = 1, D_j = x | G_i] \, dx$$

$$= \int \frac{P[p_j = 1, D_j = x, G_i]}{P[G_i]} dx$$

$$= \frac{A_{ji}(1, G_i) \times \int H(1, D_j = x) dx}{(A_{ji}(0, G_i) \times \int H(0, D_j = x) dx) + (A_{ji}(1, G_i) \times \int H(1, D_j = x) dx)}$$

$$= \frac{(1 + e^b) \exp[\epsilon_j + (G_i \times f_j)]}{(1 + e^a) + (1 + e^b) \exp[\epsilon_j + (G_i + f_j)]}$$

Which means:

$$P[p_j = 1 | G_i] = \frac{\exp[\epsilon_j + (G_i + f_j)]}{C + \exp[\epsilon_j + (G_i \times f_j)]} \quad (13)$$

where: $C = \dfrac{1 + e^a}{1 + e^b}$

Now, if $G_i = 1$, it can be expected that the probability that $p_j = 1$ would depend in some way on the relative intensity for that peak, $I_j$. For example, for the peaks listed in Table 1, one can expect to almost always have the peak at 388.865 (relative intensity 500) present if helium were present, but would not be surprised if the peak at 396.4729 (relative intensity 20) did not always show up. Therefore, the parameter $f_j$ in equation (14) should be a function of the relative intensity.

On the other hand, if $G_i = 0$, the probability that $p_j = 1$ can be expected to be extremely small. Furthermore, this type of "noise" term should be independent of the particular gas or peak under consideration. With this in mind, define $\epsilon = \epsilon_j$ $j$. Furthermore, if $P[p_j = 1 | G_i = 0]$ is set equal to 0.001, then using the values for a and b defined earlier (a = −2.197 and b = −5.95) $\epsilon = -6.8$ results.

A linear function for $f_j$ can be chosen. One that works quite well in practice is the following:

$$f_j = 7.3244 + (.018847 \times K_j) \quad (14)$$

where: $K_j = \begin{cases} = I_j & \text{if } I_j < 100 \\ = 100 & \text{if } 100 \leq I_j < 150 \\ = 150 & \text{if } 150 \leq I_j < 250 \\ = 225 & \text{if } I_j \geq 250 \end{cases}$ Using these values, peaks with a relative intensity of over 250 have a 99% probability of occurring, those with an intensity of 100 have a 91% probability, and those with an intensity of only 20 have a 69% probability.

Finally, equation (12) can be used to determine reasonable values for the $\delta_j$'s However, as described below this is not necessary.

Summary:

Equations (5) and (10), provide the parameters for the acceptor functions $Q(.,...,.)$, $H(.,.)$, respectively, while equations (11) and (14) provide the parameters for the acceptor function $A_{ji}(.,.)$. Furthermore, a good "guess" for the values of these parameters is given by:

q = some number close to 1 a = −2.197 b = −5.95

$\sigma$ is found from calibration $\epsilon_j = \epsilon = -6.8$ $f_j$ is found in equation (14). (15)

SOLVING THE PATTERN MODEL

The next step is to solve the pattern model, i.e., to use the model that has been constructed above to actually determine which gases and table entries are present given a particular OES spectra.

One fairly common technique for solving pattern models is the method of stochastic relaxation (see S. Geman and D. Geman, "Stochastic Relaxation, Gibbs Distributions and the Bayesian Restoration of Images," IEEE PAMI-6, pp. 721–741 (1984), for a complete description) in which one starts with some initial configuration of the graph (i.e., some arbitrary value for each of the sites) and then updates each site in turn by choosing a random value from the conditional probability distribution specified by the neighborhood of that site. For example, to update the value of $G_i$, one would use the conditional probability distribution given in equation (12) along with the current values of $P_1, \ldots, P_{M_i}$. If this process is continued long enough, the most likely configurations will appear most often. Simulated annealing (also described by S. Geman and D. Geman, see above) combined with stochastic relaxation provides a means for forcing the process to converge to the most likely (or one of the most likely) states.

The disadvantage of stochastic relaxation is that it is time consuming, and therefore two other techniques for solving the pattern model will need to be considered. The first will work effectively as long as the number of gases is fairly small (e.g., N<20). The second combines the first technique with the method of stochastic relaxation in order to be effective on larger graphs.

Maximizing the A Posteriori Probability

First consider the case where there are no B sites (S=0). Then by Bayes theorem:

$$P[G_1, \ldots, G_N, p_1, \ldots, p_{MN} | D_1, \ldots, D_{MN}] =$$
$$= K \times f[D_1, \ldots, D_{MN} | p_1, \ldots, p_{MN}, G_1, \ldots, G_N] \times$$
$$\quad P[p_1, \ldots, p_{MN}, G_1, \ldots, G_N]$$
$$= K \times f[D_1, \ldots, D_{MN} | p_1, \ldots, p_{MN}, G_1, \ldots, G_N] \times$$
$$\quad P[p_1, \ldots, p_{MN} | G_1, \ldots, G_N] \times P[G_1, \ldots, G_N]$$
$$= K \times f[D_1 | p_1] \times \ldots \times f[D_{MN} | p_{MN}] \times P[p_1 | G_1] \times \ldots \times$$
$$\quad P[p_{MN} | G_{MN}] \times P[G_1] \times \ldots P[G_{MN}]$$

Where K is some constant and the last expression follows from the Markov property.

The above can be rewritten as:

$$P[G_1, \ldots, G_N, p_1, \ldots, p_{MN} | D_1, \ldots, D_{MN}] = \quad (16)$$

-continued $$K \times \prod_{i=1}^{N} \prod_{j=M_{i-1}+1}^{M_i} f[D_j|p_j] \times P[p_j|G_i] \times P[G_i]$$

The problem is to find the values for $G_1, \ldots, G_N, p_1, \ldots, p_{MN}$ which maximize equation (16). Note that these values depend on the $D_j$'s and that these values may not be unique, since more than one configuration of $G_j$'s and $p_j$'s may achieve the maximum. At any rate, the (or one of the) maximizing configurations are referred to herein as $\mathcal{H}(D_1, \ldots, D_{MN})$.

$\mathcal{H}$ is easy to determine since the lack of B sites means that each G site and its associated P and D sites form a separate and independent graph. Therefore, the first product in equation (16) can be broken and each gas treated separately. Furthermore, just the expression $f[D_j|p_j] \times P[p_j|G_i]$ can be used to determine the optimal value of $p_j$ in the cases where $G_i=0$ and $G_i=1$. Using the parameters specified in equation (15) it is easy to show that $p_j$ should be nonzero only if:

$$G_i = 1, D_j \neq 0,$$

$$|D_j - \omega_j| < \sigma \times \sqrt{1.75 + 2(\epsilon + f_j - a)}$$

With this "rule" and the values of the a priori probabilities $P[G_1]$, one can determine $\mathcal{H}(D_1, \ldots, D_{MN})$.

If B sites do exist, (S>0), then not all of the D sites are known. However, if one assumes q=1, then the linear restriction in equation (5) implies that there are a finite number of possible D site values. (For example, if k D sites connect to a B site, then there are $(2^k-1)$ possible values for these D sites.) If $\Delta$ is defined as the set of all possible configurations of the D's then the problem involves finding $\mathcal{H}$, which is the configuration which maximizes:

$$\Psi(D_1, \ldots, D_{MN}) = \prod_{i=1}^{N} \prod_{j=M_{i-1}+1}^{M_i} f[D_j|p_j] \times P[p_j|G_i] \times P[G_i] \quad (17)$$

over all $(D_1, \ldots, D_{MN}) \in \Delta$ and where the values of $G_1, \ldots, G_N, p_1, \ldots, p_{MN}$ are specified by $\mathcal{H}(D_1, \ldots, D_{MN})$ in each case.

This method works well if the graph is fairly small. For large graphs, however, another approach is needed.

Selective Stochastic Relaxation

As noted above, stochastic relaxation requires that each site of the graph be updated in turn over and over again until stochastic convergence occurs. Obviously, such a method may be very time consuming. In this section a more efficient method of stochastic relaxation is considered which makes use of the insights provided by the method of maximization described above. The method will involve considering just the G sites as a new Markov random field.

In the same way that the function $\mathcal{H}$ was introduced in the last section, let's define function $\chi(G_1, \ldots, G_N)$ which gives the optimal configuration of the D's and P's, for specific values of $G_1, \ldots, G_N$. Furthermore, let's define the probability density function:

$$\Phi(G_1, \ldots, G_N) = \frac{1}{Z} \prod_{i=1}^{N} \prod_{j=M_{i-1}+1}^{M_i} f[D_j|p_j] \times P[p_j|G_i] \times P[G_i] \quad (18)$$

$$= \frac{1}{Z} \prod_{j=1}^{M_N} f[D_j|p_j] \times P[p_j|G_{(j)}] \times \prod_{i=1}^{N} P[G_i]$$

where: $Z = \sum_{G_1} \ldots \sum_{G_N} \prod_{j=1}^{M_N} f[D_j|p_j] \times P[p_j|G_{(j)}] \times \prod_{i=1}^{N} P[G_i]$ Where the values of the D's and the P's are taken from $\chi(G_1, \ldots, G_N)$ in each case. (Note that $G_{(j)}$ refers to the G site which connects to $p_j$.)

Therefore, to find the optimal configuration given the B sites, the largest value of $\Phi$ must be found over all possible values of the G's.

The algorithm:

Consider the following stochastic relaxation algorithm for finding the optimal configuration:

Step 1
Initialize the values of $(D_1, \ldots, D_{MN})$ by assigning the value of each B site to the one connecting D site whose corresponding $\omega_j$ is closest to the value of the B site. For example, if sites $D_1$, $D_2$, and $D_3$ are connected to B, and if $|\omega_2-B| < |\omega_3-B| < |\omega_1-B|$ then $D_2=B$ and $D_1=D_3=0$ would be assigned.

Step 2
Find $\mathcal{H}(D_1, \ldots, D_{MN})$ and assign the G and p sites accordingly.

Step 3
Visit each of the G sites in turn. At the $i^{th}$ G site, choose $G_i$ randomly from the probability distribution given by:

$$G_i = \begin{cases} = 0 \text{ with probability: } \frac{\Phi_i(0)}{\Phi_i(0) + \Phi_i(1)} \\ = 1 \text{ with probability: } \frac{\Phi_i(1)}{\Phi_i(0) + \Phi_i(1)} \end{cases}$$

where
$\Phi_i(k) = \Phi(G_1, \ldots, G_{i-1}, k, G_{i+1}, \ldots, G_N)$ with k=0 or 1, and $$\frac{\Phi_i(k)}{\Phi_i(0) + \Phi_i(1)}$$

is the conditional probability.

Step 4
Find $\chi(G_1, \ldots, G_N)$ and update the sites accordingly.

Step 5
Repeat steps 3 and 4.

The outlined method is called herein selective stochastic relaxation because only the G sites are visited. This method is faster than the method discussed in the previous section because only one of the G sites is changed at a time and therefore in step 4 only part of $\Delta$ needs to be considered to update $\chi$.

Why this method is easier than maximizing the a posteriori:

In order to understand why only part of $\Delta$ needs to be considered, the following four sets are defined:
$\Omega_i = \{j: (M_{i-1}+1) \leq j \leq M_i\}$ $\Theta_i = \{B_t: \Omega_i \cap (t_1, \ldots, t_{k(t)}) \neq \phi\}$ (Where $d_{t1}, \ldots, D_{tk(t)}$ are the sites which connect to site $B_t$, and $\phi$ indicates the null set.)

$\pi_i = \{(t_1, \ldots, t_{k(t)}): B_t \in \Theta_i\}$ $N(i) = \{G_l(l \neq i): \pi_i \cap \Omega_l \neq \phi\}$ N(i) is referred to as the neighborhood of $G_i$ which by the above formulation consists of those G sites which connect indirectly to $G_i$ through a commonly shared B site.

Figure 5:
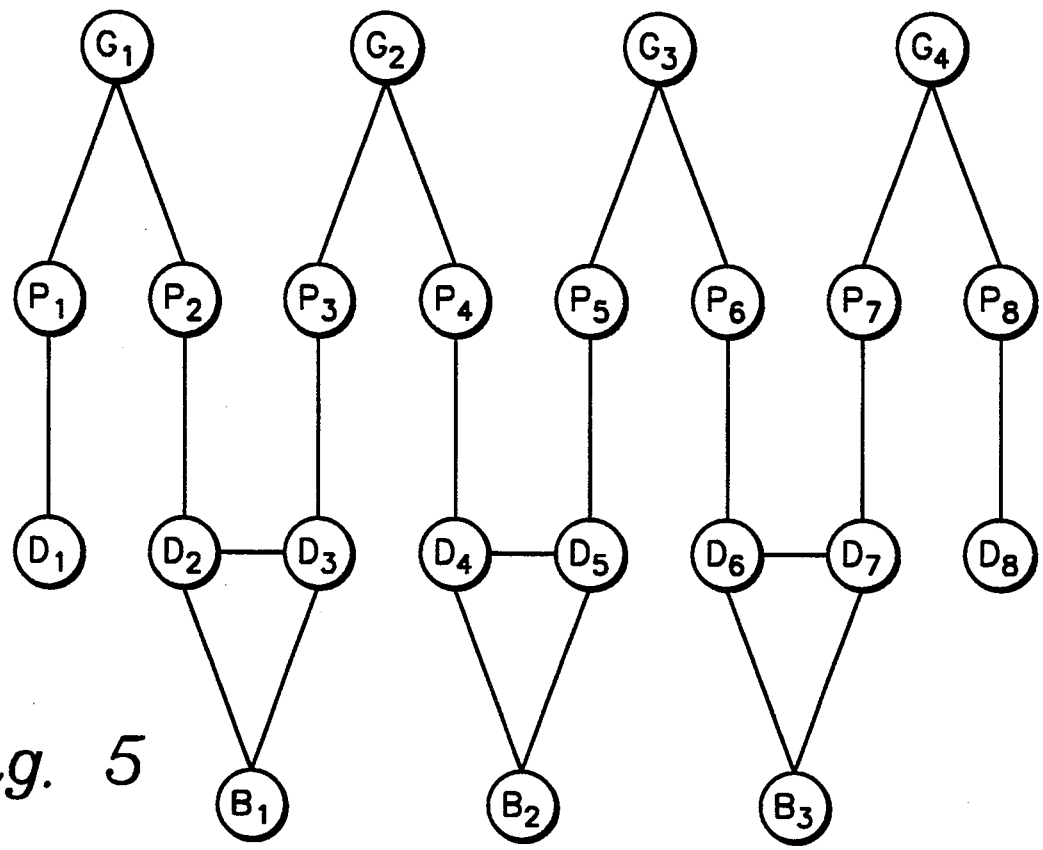
FIG. 5 is a diagram of another sample connector structure useful in describing selective stochastic relaxation pursuant to the present invention.

As an example, consider the OES pattern displayed in FIG. 5.

Here, $\Omega_1 = \{1,2\}$ $\Omega_2 = \{3,4\}$ $\Omega_3 = \{5,6\}$ $\Omega_4 = \{7,8\}$ $\Theta_1 = \{B_1\}$ $\Theta_2 = \{B_1, B_2\}$ $\Theta_3 = \{B_2, B_3\}$ $\Theta_4 = \{B_3\}$ $\pi_1 = \{2,3\}$ $\pi_2 = \{2,3,4,5\}$ $\pi_3 = \{4,5,6,7\}$ $\pi_4 = \{6,7\}$ $N(1) = \{G_2\}$ $N(2) = \{G_1, G_3\}$ $N(3) = \{G_2, G_4\}$ $N(4) = \{G_3\}$ Now, for any site i $(1 \leq i \leq N)$, equation (18) can be rewritten as:

$$\Phi(G_1, \ldots, G_N) = \frac{1}{Z} \prod_{j \notin \pi_i \cup \Omega_i} f[D_j|p_j] \times P[p_j|G_{(j)}] \times \qquad (19)$$

$$\prod_{G \notin N(i)} P[G] \times \prod_{j \; \pi_i \cup \Omega_i} f[D_j|p_j] \times P[p_j|G_{(j)}] \times \prod_{G \; N(i)} P[G]$$

Where $p_1, \ldots, p_{MN}, D_1, \ldots, D_{MN}$ are specified by $\chi(G_1, \ldots, G_N)$, i.e., the optimal values given the G's. Note that $\chi(G_1, \ldots, G_{i-1}, 0, G_{i+1}, \ldots, G_N)$ and $\chi(G_1, \ldots, G_{i-1}, 1, G_{i+1}, \ldots, G_N)$ only differ in those values of $p_j$ and $D_j$ for which $j \in \pi_i \cup \Omega_i$. This simplifies the calculation in step 4 and implies that the conditional probability can be written as:

$$\Phi(G_i|G_1, \ldots, G_{i-1}, G_{i+1}, \ldots, G_N) = \qquad (20)$$

$$\frac{\prod_{j \in \pi_i \cup \Omega_i} f[D_j|p_j] \times P[p_j|G_{(j)}] \times \prod_{G \in N(i)} P[G]}{\sum_{G_i = 0}^{1} \prod_{j \in \pi_i \cup \Omega_i} f[D_j|p_j] \times P[p_j|G_{(j)}] \times \prod_{G \in N(i)} P[G]}$$

Hence, a (new) Markov random field with neighborhood structure defined by the N(i)'s is created. If selective stochastic relaxation is used, the most likely configurations will appear most often.

Results

Figure 6:
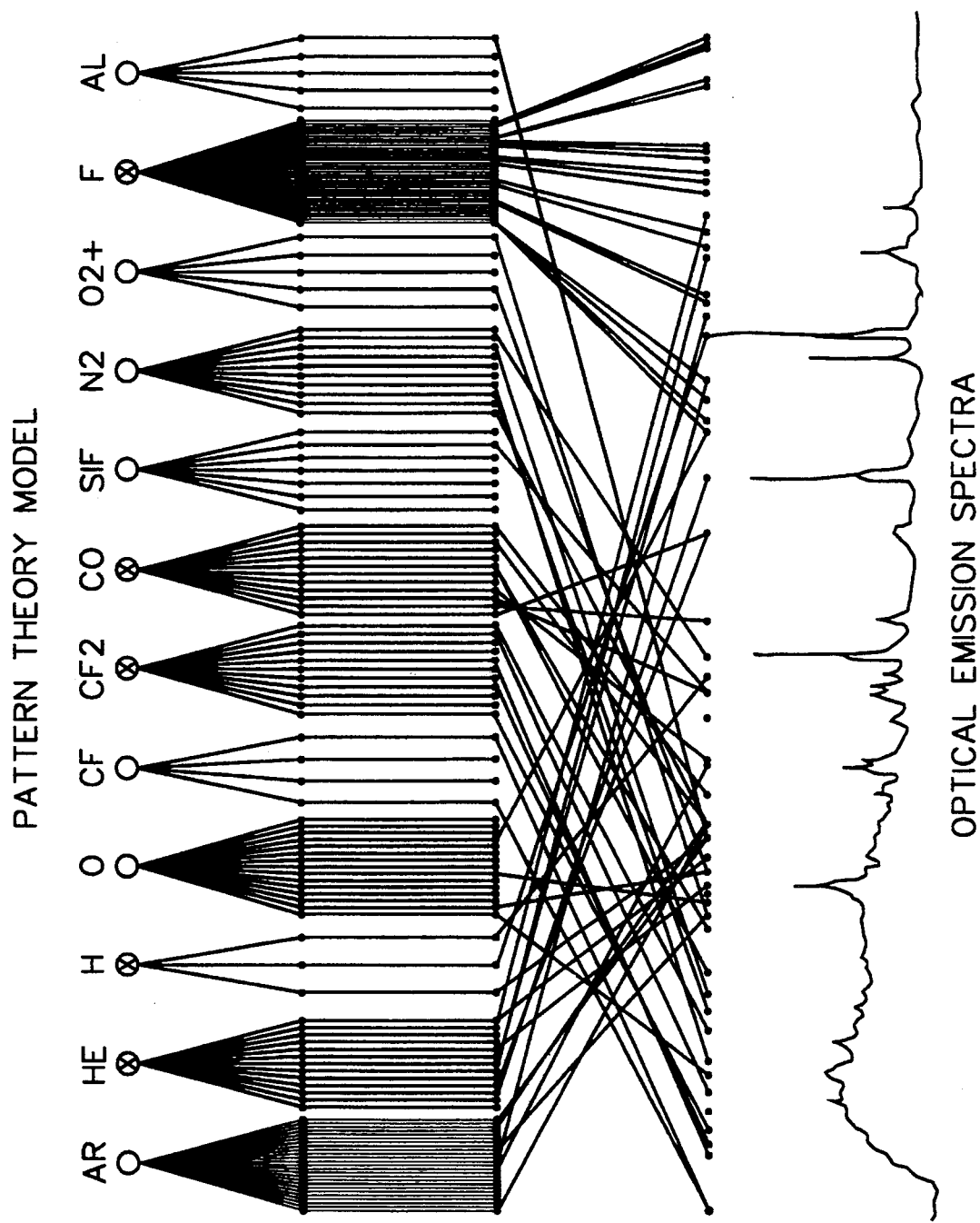
FIG. 6 is a graph of a sample pattern theory model useful in understanding the present invention.
Figure 7:
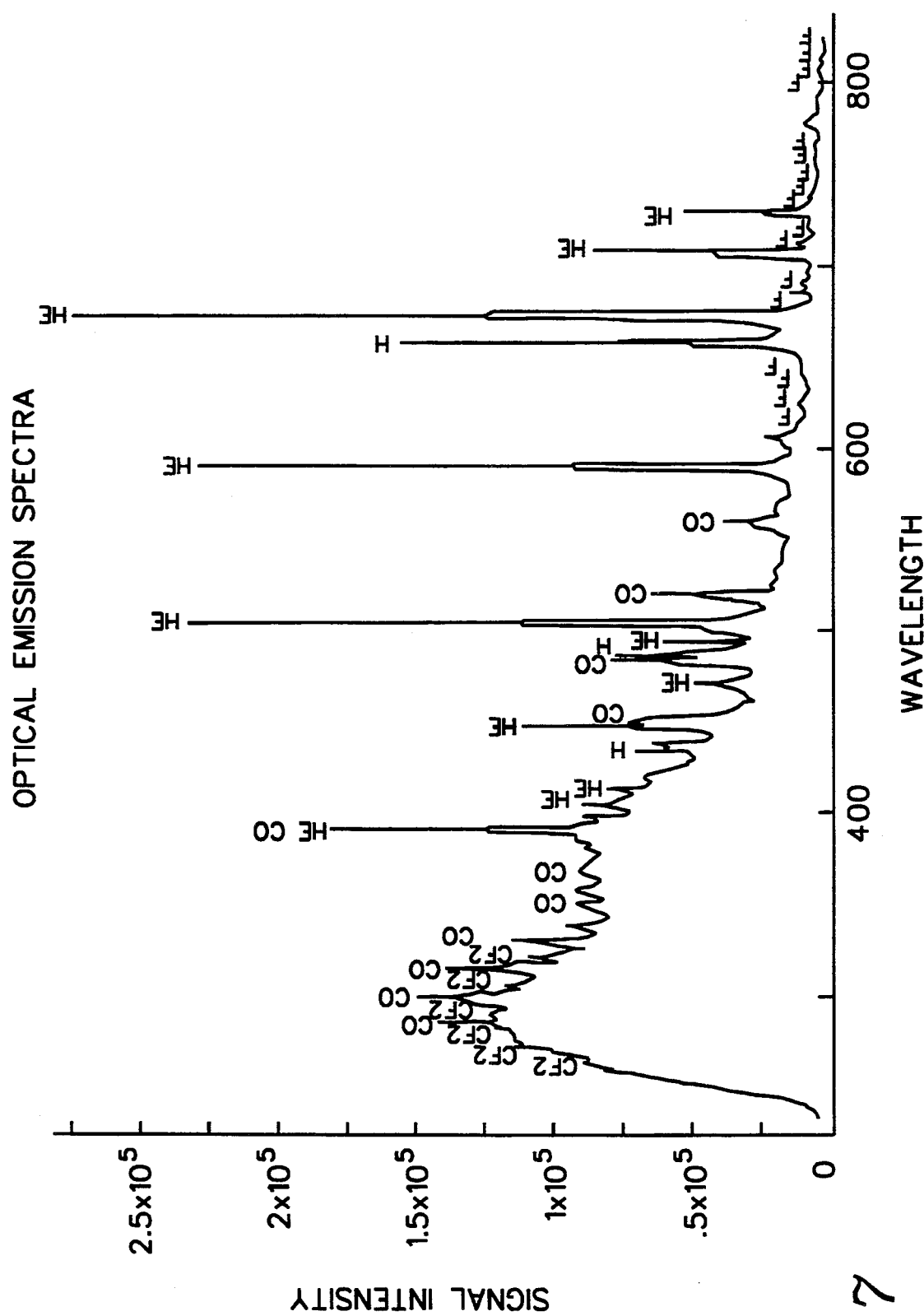
FIG. 7 is a hand drawn representation of a filtered-version graph of the optical emission spectra of FIG. 3.

FIG. 6 shows the pattern model that results if the same OES data that was presented in FIG. 3 is used. The X's in the G sites indicate that the model has detected the presence of five gases: He, H, $CF_2$, CO, and F. The resulting peak identification is shown in FIG. 7 which can be thought of as a "filtered" version of FIG. 3. Note that only one peak in the graph is still multiply assigned (the peak at 388.98 nm which is assigned to both helium and carbon monoxide). Multiple assignments can, in fact, be the correct case if the resolution used is insufficient to resolve adjacent peaks.

To summarize up to this point, practical methods for interpreting optical emission spectroscopy data have been presented. A method for identifying and sharpening the peaks has been described, and an inadequate model and a practical model for identifying the gases which are responsible for those peaks have been introduced. Both models make use of readily available table data which describe where peaks for particular gases should occur. As was pointed out, the simple table look-up model is the easiest to implement, but proves to be inadequate once a reasonable number of gases are considered. This is due, in part, to the fact that the table look up method fails to consider the complexities of OES data and imperfections in the data collection process. A pattern theoretical model was introduced which takes these difficult into consideration and provides an effective means for identifying the gases.

The balance of this application best mode description is devoted to providing specific examples of an automated system and method which take advantage of the novel algorithms presented. However, a few general observations concerning the novel algorithms set forth above are first noted.

Now that the feasibility of the pattern model has been demonstrated, the next step is to build a database of all species of interest. By way of example, for reactive-ion-etching (RIE) wafer production, a typical gaseous species list may total 37 species of interest: Al, Ar, $Ar^+$, Br, $Br^+$, Cl, F, He, O, $O^+$, Si, Cu, Pt, S, Na, NO, $O_2^+$, OH, SiCl, SO, SiF, $SiF_2$, AlCl, AlO, BCl, $Br_2^+$, $CF_2$, CH, CN, CO, $CO^+$, $Cl_2$, $Cl_2^+$, $HCl^+$, $N_2$, $N_2^+$, H. Approximately 10–50 table entry values for each species can be expected if the peaks of greatest intensity are listed, resulting in a pattern model with approximately 2000 sites (not including the B sites).

As another consideration, despite the accuracy of FIG. 7, the peak at 388.98 was doubly assigned. This is because the model failed to take into consideration the fact that atomic emission peaks (He) are very narrow, while molecular emission emission (CO) are generally wider. An obvious extension to the model, therefore, is to modify the D sites in the graph to also take into consideration this characteristic. Just as a large difference between the location of a peak in the graph and $\omega_j$ lowers the likelihood of the peak being the result of the $j^{th}$ table entry, differences between the expected and actual shape would influence the likelihood. Some of this peak shape information is provided in spectroscopy tables, but most of the information would have to be gained through experience (i.e., maximum likelihood and similar techniques).

Further, guidelines for assigning the parameters have been discussed above, but more accurate estimates could be made if data were available. Ideally the model should learn from its own mistakes. The EM algorithm (see A. Dempster, N. Laird, and D. Rubin, "Maximum Likelihood from Incomplete Data Via the EM Algorithm (with Discussion)", J. Royal Statistical Soc. 39, pp. 1–38 (1976)) provides a method for making this possible. The most important parameters to improve are the $f_j$'s and the prior probabilities. This improvement can be accomplished very simply by keeping a database of all interpreted OES spectra and, once enough data has been collected, using the logistic regression model suggested by equation (12).

Figure 8:
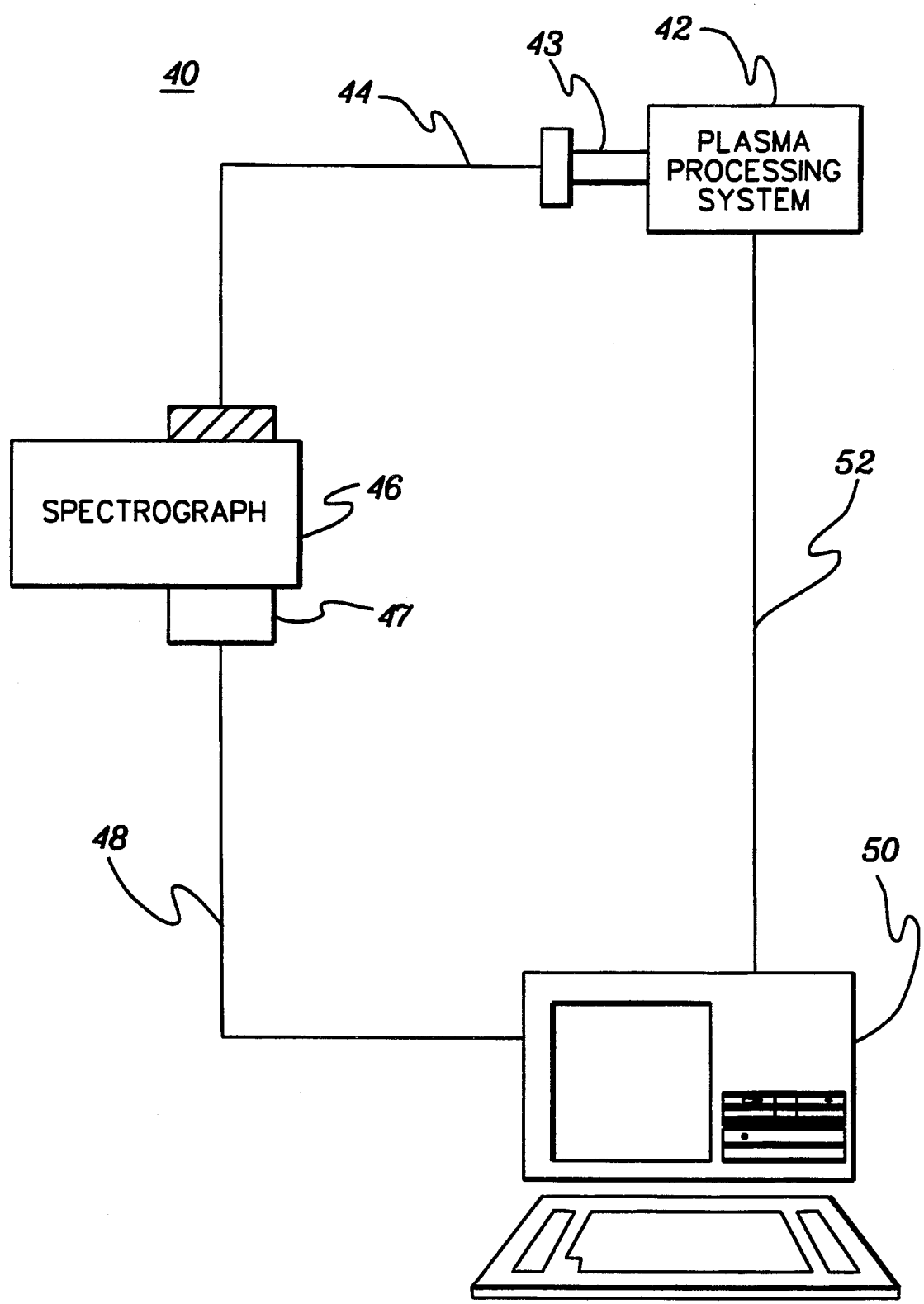
FIG. 8 is a block diagram of one embodiment of a closed loop processing system pursuant to the present invention.

Turning now to a system and method implementation of the present invention utilizing the above-described algorithm, reference initially the closed loop system diagram, generally denoted 40, depicted in FIG. 8.

Optical emission spectroscopy (OES) is a sensitive analytical technique that can provide detailed information about the chemical composition and energy states of atoms and small molecules excited by an appropriate energy source. A plasma processing system 42 is conventionally used in semiconductor manufacturing for etching and depositing materials having such an energy source. FIG. 8 depicts generic plasma processing system 42 being coupled by a fiber optic cable 44 to a generic spectrograph 46. As is well understood in plasma processing, an energy source excites electrons in the gas used for processing the semiconductor. The deexcitation mechanism often produces light as absorbed energy is released by the gas. The wavelengths of this released light are determined by the difference in energy states of the atoms or molecules. Each atomic and molecular species has a unique set of wavelengths at which it emits light. This processing system can have a window 43, through which this light can be monitored. Window 43 can consist of glass, but quartz or other materials that do not attenuate light of short wavelengths are preferred.

Coupled to window 43 is fiber optic cable 44. Fiber 44, often made of silica, collects light from system 42 and passes the light to spectrograph 46. The spectrograph defracts the incoming light to separate the various wavelengths emitted by gas species in plasma processing system 42. The focal length of the spectrograph and the spacing between defraction rules on the grating determine the effective resolution of the spectrograph and thus the degree of separation of the various wavelengths. At the exit plane of the spectrograph a detector 47 is placed to intercept the defracted light. This can either be a single channel detector, if the grating will be rotated to pass multiple wavelengths by it, or a multichannel diode array or CCD (2-D array of charged coupled devices). The photodetector produces an electronic signal proportional to the flux of light it receives. If there are multiple channels then multiple electronic signals are produced.

An electronic cabling 48 carries the electric signals produced by photodetector 47 to an electronic controller/computer 50 where signals are initially converted from analog form to digital form, which can then be read by the controller/computer 50. This unit controls the time that the photodetector 47 collects each set of signals. The computer is used to run software which instructs the controller and analyzes incoming data. Preferably, the software contains feedback control algorithms (discussed below) such that the computer can send analog or digital signals out to control points (not shown) via line 52, for plasma processing system 42. The software that is run on the controller/computer determines the automatic analysis and feedback control capabilities of the monitor/control system. The techniques used in OES impurity analysis are the subject of the present disclosure. These methods provide a unique analysis capability with a high level of confidence that allows automated feedback to the plasma processing system 42.

Figure 9:
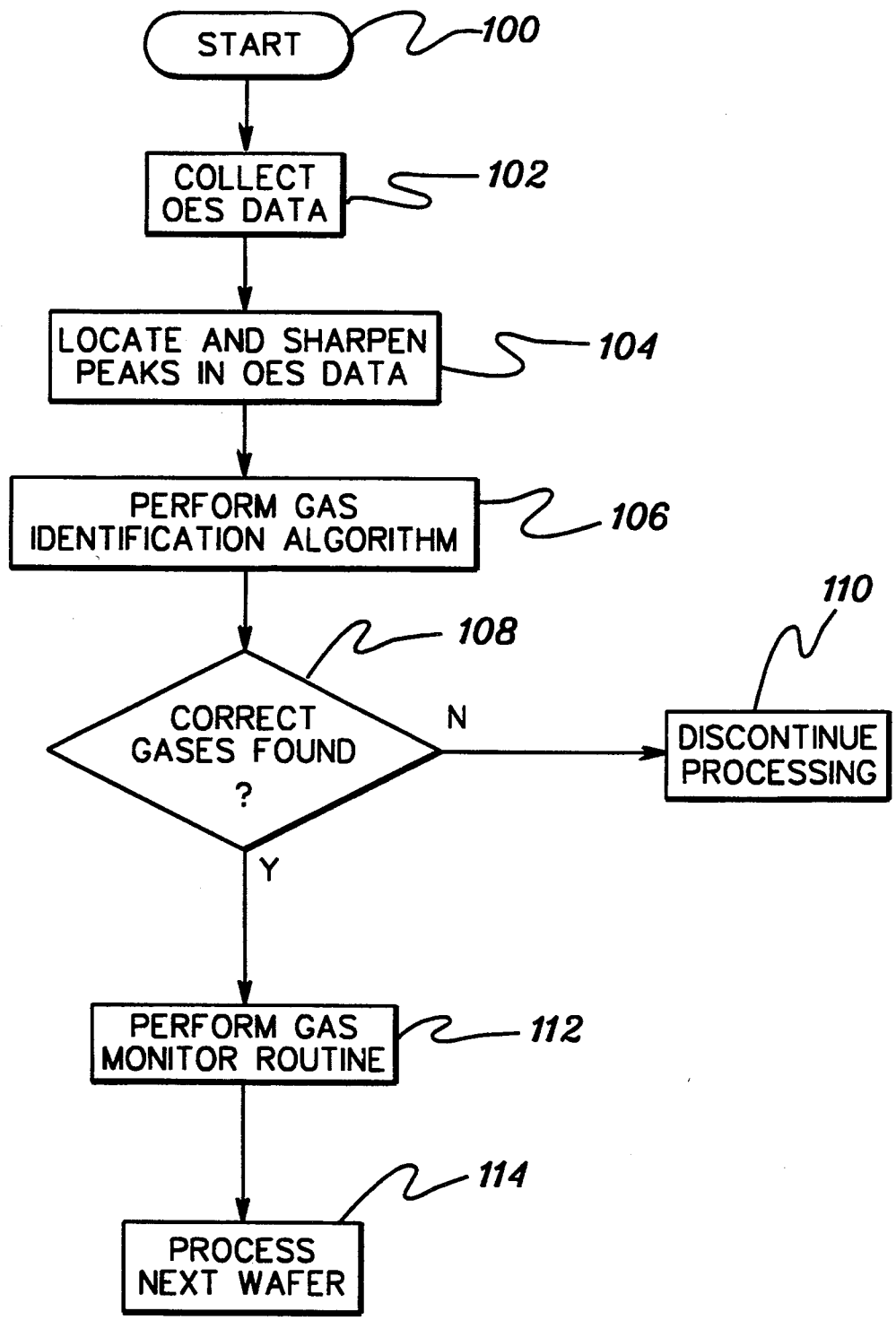
FIG. 9 is a flowchart of one embodiment of a closed loop fabrication monitoring and control method pursuant to the present invention.

One monitor and control process embodiment pursuant to the present invention is set forth in the flowchart of FIG. 9. This process is employed at least once, and preferably multiple times, during the processing of a single wafer within the semiconductor manufacturing apparatus of FIG. 8 (i.e., within a single predefined semiconductor fabrication interval).

As shown, monitor and control processing begins, 100 "Start," with a collection of OES data, 102 "Collect OES Data." OES data is readily available using existing commercially available optical emissions spectroscopy (OES) equipment. As noted above, the data is multivariant and conventionally comprises a graph of measured wavelengths versus intensity of each wavelength emission at a given point in time. OES data is accumulated through a plurality of sensors associated with the fabrication chamber. In a typical implementation each OES sensor is dedicated to a single wavelength.

After data is collected, each peak in the OES data is located and sharpened, 104 "Locate and Sharpen Peaks In OES Data," subsequent to which the desired gas identification algorithm is implemented, 106 "Perform Gas Identification Algorithm." (Each of these functions/algorithms is discussed in detail herein.) Continuing with the flowchart, a priori knowledge is used to determine whether incorrect gaseous species have been identified, 108 "Correct Gases Found?". If "no", then processing is discontinued, 110 "Discontinue Processing" and a control signal can alert an operator to shutdown the manufacturing process. If desired, the full list of gases found can be presented to an operator for diagnostic purposes. If correct gases are present, wavelength intensity levels are reviewed, 112 "Perform Gas Monitor Routine," to verify that the levels are with anticipated values for a given stage in the semiconductor manufacturing process. (See FIG. 15 discussion below) Alternatively, if correct gases are not found, rather than immediately discontinuing processing, the "Perform Gas Monitor Routine" could be completed on data obtained up to that point. Also, predefined or derived limits on changes in intensity levels could be used to confirm a decision to stop wafer processing. This could reduce a false alarm rate for the methodology. Thereafter, present processing through the main loop of FIG. 9 is completed, and the processor may await the next wafer, 114 "Process Next Wafer."

Alternatively, the main processing routine of FIG. 9 could be readily configured to repetitively loop a fixed number of times or after a fixed time interval, in order to repetitively execute the monitor/control function during the fabrication interval of a single semiconductor wafer within the plasma processing chamber. (This possibility is described further below in connection with FIG. 15). Detailed examples of the main processing routines noted above are next described with reference to FIGS. 10-15.

Figure 10:
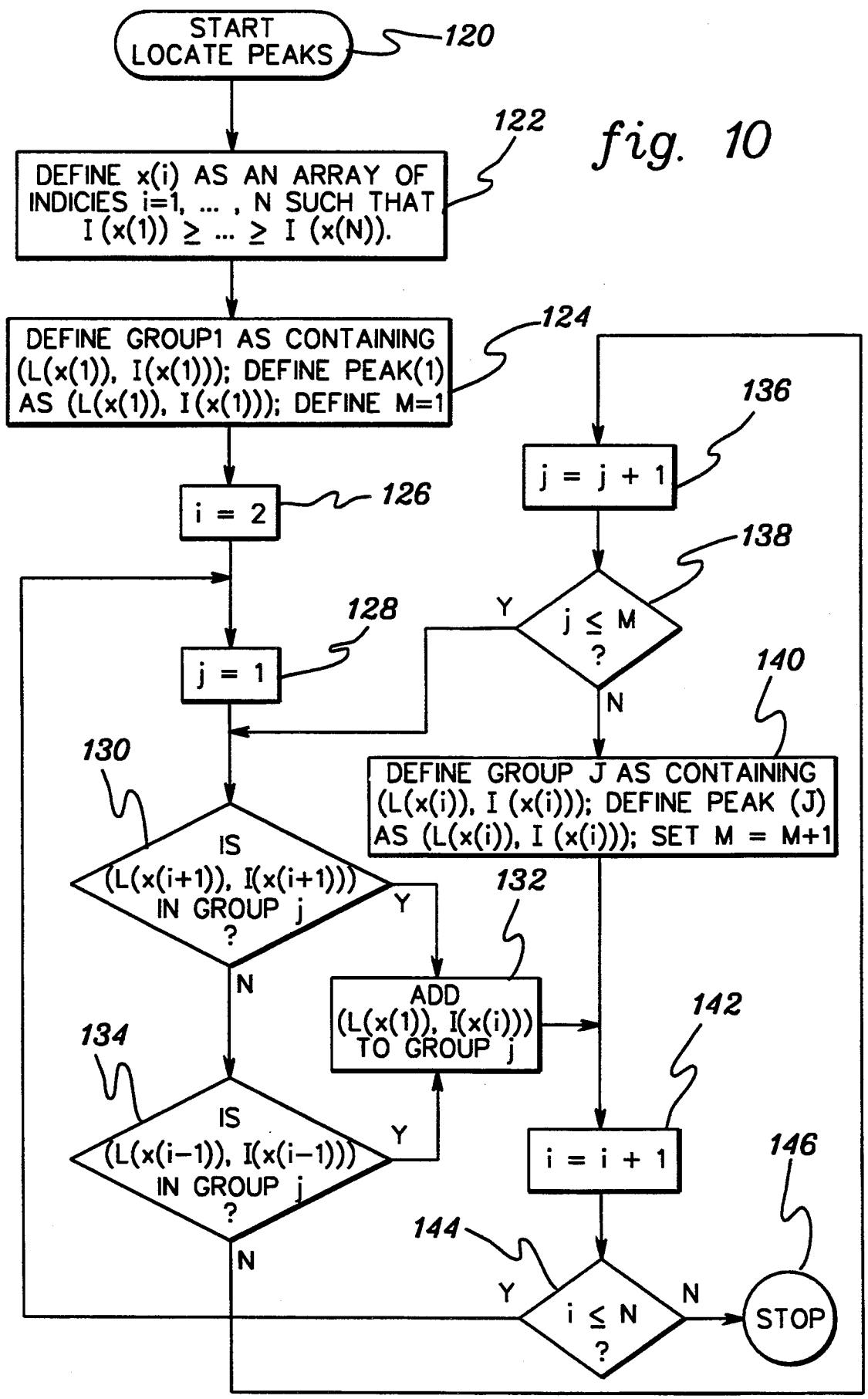
FIG. 10 is a flowchart of one embodiment of the locate and sharpen peaks step of FIG. 9.

FIG. 10 comprises one example of locate peaks processing pursuant to the present invention. The processing flow assumes that a set of ordered pairs (L(i), I(i)) of wavelength and intensity are provided as input, wherein i=1, . . . ,N (i.e., the OES data). The output comprises a set of peaks. (Again, the optical emission spectrometer contains a large number of light sensing diodes, each of which is tuned to sense light emissions of a specific wavelength.) Processing begins, 120 "Start Locate Peaks," by sorting the data from highest intensity to lowest intensity, 122 "Define x(i) As An Array of Indices i=1, . . . , N such that $I(x(1)) \geq \ldots \geq I(x(N))$." Once the peaks are sorted from most intense to least intense, then the wavelength readings which form a particular peak are grouped together, 124 "Define Group1 as Containing (L(x(1)), I(x(1))); Define Peak(1) as (L(x(1)), I(x(1))); Define M=1." As used herein, the term "group" includes those wavelength readings comprising the lowest OES data points to the highest OES data point for each peak in the graph. A group is defined as a valley with a peak to another valley. Thus, group1 contains the largest peak in the graph with all points surrounding it until the adjacent valleys are encountered. The variable "M" is used to track the number of groups found. The first entry into each group will be the peak because that is the highest point. Grouping of peaks allows for only the most intense peak groups to be considered as viable data. The remaining "peaks" may be merely indicative of noise within the OES data.

A second data point is selected, 126 "i=2," and the variable "j" is initially assigned to group1, 128 "j=1." Variable "j" tracks the number of groups formed, again with a total anticipated number of M. Those skilled in the art will recognize that two loops are presented in FIG. 10. The variable "i" proceeds from 2 to the total number of data points N, while the variable "j" tracks the groups from one to the total number of defined groups M.

Next, the processor considers whether the next set of ordered pairs belongs to the subject group, 130 "Is (L(x(i+1)), I(x(i+1))) In Group j?" If "yes", then the present ordered pair is added to the group, 132 "Add (L(x(1)), I(x(i))) To Group j," and the next data point is selected for consideration, 142 "i=i+1." If the answer to inquiry 130 is "no", then inquiry is made as to whether the last data set was in group j, 134 "Is (L(x(i−1)), I(x(i−1))) In Group j?" If the last point was in group j, then the present point identifies a valley and it is added to the subject group at instruction 132 (discussed above). Thereafter, another data set is selected, 142 "i=i+1," and inquiry is made whether all N data sets have been processed, 144 "i≦N?" Once all data points have been grouped, processing ceases, 146 "Stop." Assuming that present variable "i" has not exceeded the total number of data points, then processing loops back to instruction 128 where the new data point is considered for inclusion in the subject group.

The second of the two loops in FIG. 10 branches from inquiry 134 where if neither the next data pair nor the previous data pair are in group j, then a new group (j+1) is formed, 136 "j=j+1." Once a new group is defined, variable "j" is compared with the total number of known groups M, 138 "j≦M?" Assuming that this new group number is within the known number of groups M, then processing loops back to inquiry 130. If all existing groups have been exhausted, processing proceeds to instruction 140 "Define Group J as Containing (L(x(i)), I(x(i))); Define Peak (J) As (L(x(i)), I(x(i))); Set M=M+1." Thus, the total number of existing groups is increased by 1. Processing then returns to instruction 142 for selection of a next data pair. FIG. 10 processing continues until each measured data pair is assigned to a particular "grouping" of data pairs.

Those skilled in the art will recognize that other, alternative algorithms can be defined for locating peaks within the graph. For example, one alternate approach is to simply look at the sequence of intensities, I(i), and recognize that a peak occurs whenever a local maximum is achieved and a valley occurs whenever a local minimum is achieved. Groups, as defined above, consist of the set of ordered pairs between local minima.

Once all data peaks have been located, each peak in the graph is sharpened using an extrapolation procedure such as that described above with respect to FIG. 2. Briefly, as many data points as necessary are used to the left and to the right of a peak to fit the best two regression lines thereto. The subject peak is then redefined (i.e., sharpened) as the data point (both wavelength and intensity) where the two regression lines intersect. (High intensity peaks require more data points on each side of the peak for best fit regression lines.) Those skilled in the art will recognize that other extrapolation methods can also be used.

The next step in the main processing of FIG. 9 is to perform gas identification. One implementation approach to this processing is set forth in FIGS. 11–13b.

Figure 11:
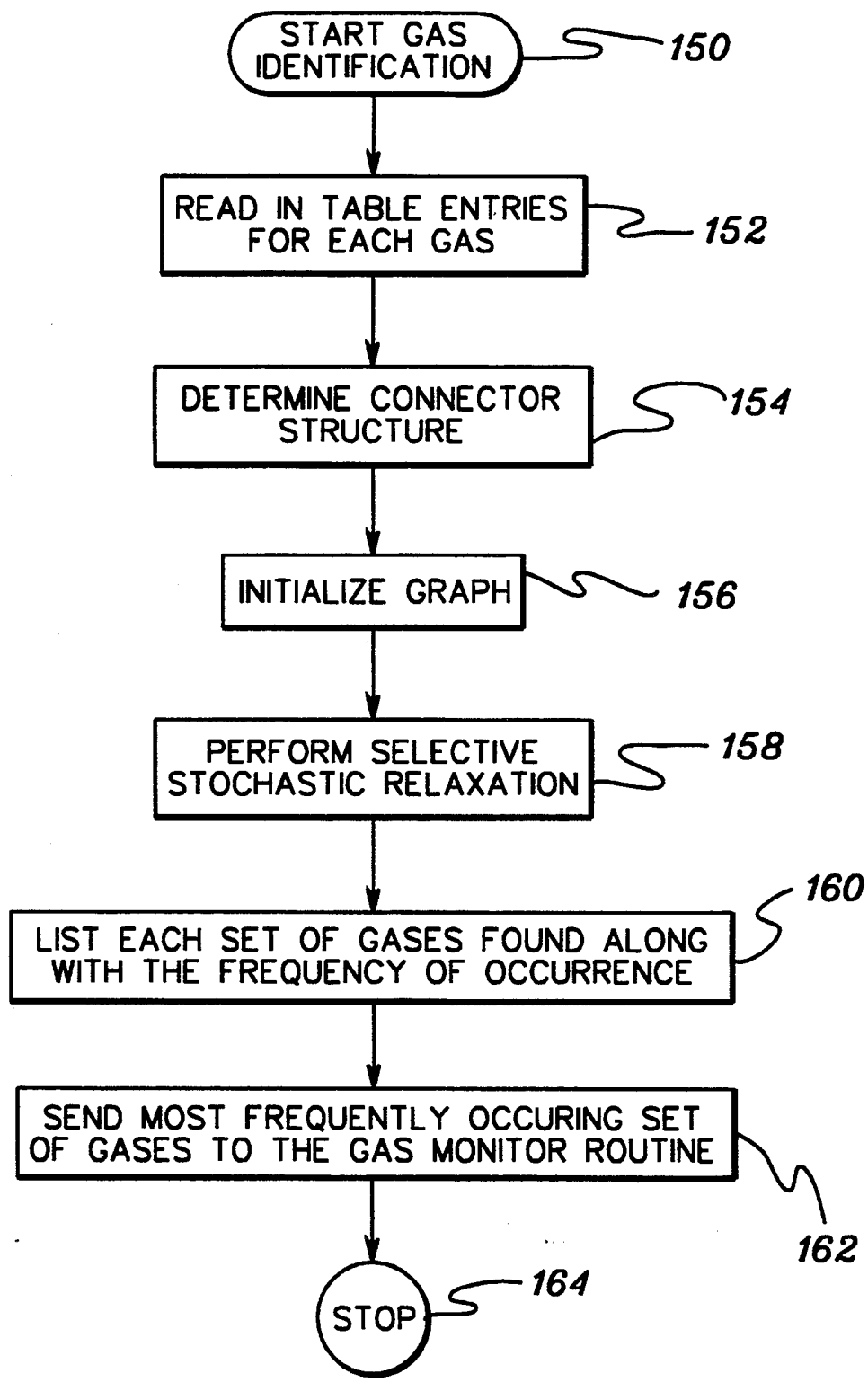
FIG. 11 is a flowchart of one embodiment of the gas identification step of FIG. 9.

Referring first to FIG. 11, processing begins, 150 "Start Gas Identification," by reading in prestored table entries for each possible gas in the chamber, 152 "Read in Table Entries for Each Gas." Again, such table entries are readily available to one skilled in the art, e.g., through the above-referenced CRC Handbook of Chemistry and Physics. Thereafter, the connector structure or Markov random field is determined for the subject OES spectra, 154 "Determine Connector Structure." One approach to establishing a connector structure is to:

Step 1:
Define a G site for each gas under consideration (i.e., each gas read from the table entries).
Step 2:
Define a P and D site for each gas table entry such that a G site connects to a P site which connects to a D site.
Step 3:
Define a B site for each peak in the OES data.
Step 4:
Connect each D site to a B site if:

$$|t-B| \leq TOL$$

Where t is the wavelength for the corresponding table entry and TOL is a predefined value.

In addition to FIGS. 4 & 5, FIG. 14 (discussed below) sets forth another example of a connector structure (or Markov random field) pursuant to the present invention.

Each gas G has an associated number of wavelength table entries in the CRC Handbook. For example, G1 might have 50, while G2 150 peaks. A wavelength corresponding to just one of these values may be indicative of the gas. A G site can only take on values 0 or 1, as can P sites, while D and B sites comprise real numbers. A G site takes on the value of 1 if the gas represented by that particular table entry is present in the graph of data. The D sites comprise the specific wavelengths which actually appear on the OES graph. For example, because of distortion in the graph (due to natural noise in the optics, etc.) an actual measured wavelength may be slightly different than the expected wavelength (i.e., table value) for a particular gas. (The connector structure for the G sites, P sites and D sites is predetermined, because there is always a G site for every gas considered, there is always a P site for every table entry value corresponding to that gas, and there is also a D site for every table entry value corresponding to that gas.) The B sites are the actual peaks measured in the OES graph data. A B site is connected with an associated D site if it is less than some predetermined tolerance away. For example, $3 \times \sigma$ (and $\sigma$ is determined from calibration). The structure is entirely predefined except for connections to specific measured B sites.

Once a particular connector structure is established, the OES graphical data is initialized, 156 "Initialize Graph" (discussed below with reference to FIGS. 12a & 12b), and selective stochastic relaxation is performed, 158 "Perform Selective Stochastic Relaxation" (described below with reference to FIGS. 13a & 13b). The result of selective stochastic relaxation is a set of gases along with their frequency of occurrence, which may be listed, 160 "List Each Set of Gases Found Along with the Frequency of Occurrence," and used to determine gas concentration levels, 162 "Send Most Frequently Occurring Set of Gases to the Gas Monitor Routine," subsequent to which gas identification processing pursuant to this embodiment ceases, 164 "Stop," and processing control returns to the main routine of FIG. 9.

Figure 12A:
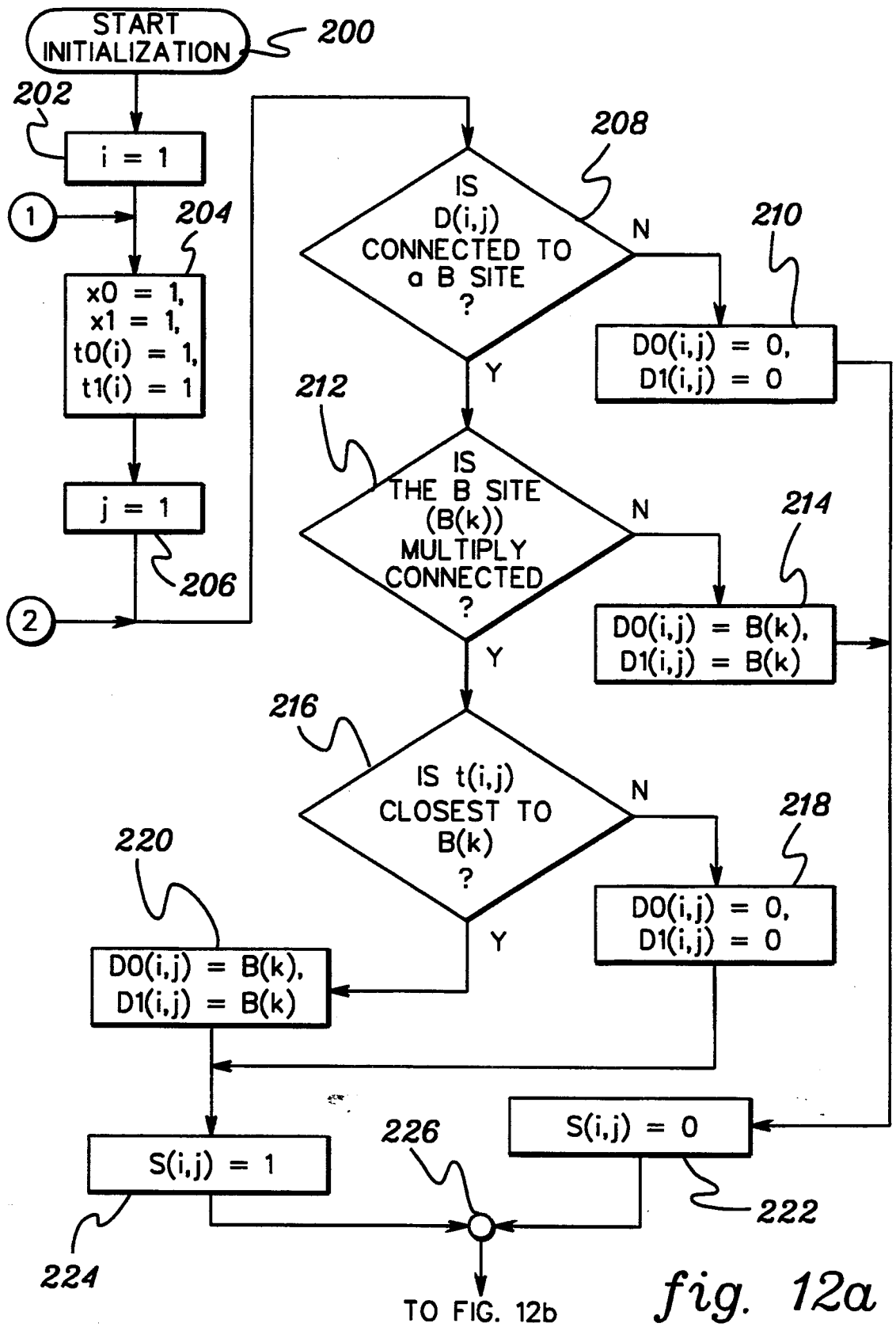
FIGS. 12a & 12b are connected flowcharts of one embodiment of the initialize graph step of FIG. 11.
Figure 12B:
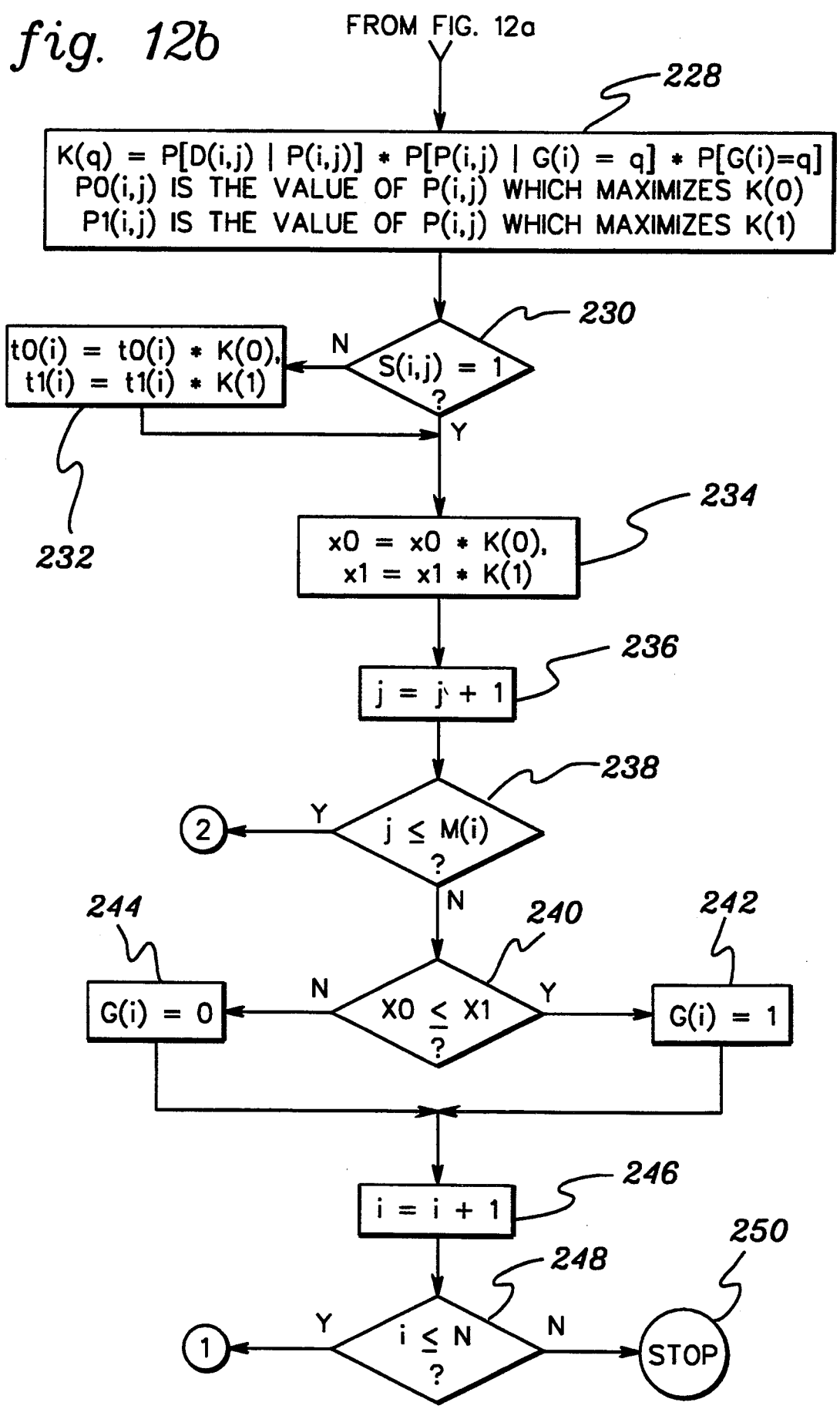

One embodiment for an "initialize graph" routine (i.e., step 156 of FIG. 11) is set forth in FIGS. 12a and 12b. In this example, it is assumed that $t(i,j)$ is the $j^{th}$ table entry for gas i, where $i=1, 2, \ldots N$, and $j=1, \ldots M(i)$. (Again, N is the total number of data points sensed, while $M(i)$ is the number of table entries associated with gas i. Initialization is designed to associate each B site to the closest D sites and to obtain an initial value for the remaining variables in the graph, i.e., the G sites, P sites and D sites based on that association. This processing is desirable in order to reduce the overall processing time.

By initializing values prior to commencing maximization processing (i.e., selective stochastic relaxation), overall processing time is improved. The algorithm of FIGS. 12a & 12b attempts to find the best starting values. The better the starting point, the faster processing will converge to an answer utilizing the maximization algorithm. The initialization algorithm considers whether one, two, or more D sites should be connected to a particular measured B site.

Initialization begins, 200 "Start Initialization," with a first data point, 202 "i=1," and variables x0, x1, t0(i) and t1(i) are each initialized to a binary 1, 204 "x0=1, x1=1, t0(i)=1, t1(i)=1." The first table entry for the first gas is selected, 206 "j=1," after which inquiry is made as to whether this D site is connected to a measured B site, 208 "Is D(i,j) Connected To a B Site?" If "no" meaning that there is no peak in the graph corresponding to that D site, the "best value" for the subject D site is to initialize D0 and D1 to "0", 210 "D0(i,j)=0, D1(i,j)=0." (The variable D0 is representative of the best value of the D site in the case where the site's associated G site is equal to 0 and the variable D1 defines the best value for the D site in the case where the associated G site is equal to 1.) This approach is implemented for each D site and each P site in the connector structure such that once the G sites are determined, appropriate values for the associated P and D sites will be known. A flag or variable S(i,j) is defined to track whether or not a subject D site is multiply connected. If the D site is not associated with a particular B site, then the variable S(i,j) is 0, 222 "S(i,j)=0" and processing proceeds through junction 226 to the remaining portion of the initialization routine depicted and described below in connection with FIG. 12b.

Should the subject D site be connected to a B site, then inquiry is made whether the B site is multiply connected, 212 "Is the B Site (B(k)) Multiply Connected?" If "no", then the variables D0 and D1 are assigned the value of the B site, 214 "D0(i,j)=B(k), D1(i,j)=B(k)." If "yes", then inquiry is made whether the subject D site is the closest site to a measured, multiply connected B site, 216 "Is t(i,j) closest to B(k)?" Again if "no", the variables D0 and D1 are assigned the value 0, 218 "D0(i,j)=0, D1(i,j)=0." Conversely, if the subject D site is closest to the multiply connected B site, then the variables D0 and D1 are assigned the measured B site value, 220 "D0(i,j)=B(k), D1(i,j)=B(k)." Thereafter, flag S(i,j) is set, indicative of a multiply connected D site, 224 "S(i,j)=1," and processing passes through junction 226 to FIG. 12b where the likelihood of particular configurations are determined.

Referring to FIG. 12b, the probability of a particular configuration is determined from a function K(q) wherein q is equivalent to the value of the subject G site. The function used is defined in instruction 228 as "$K(q)=P[D(i,j)|P(i,j)]*P[P(i,j)|G(i)=q]*P[G(i)=q]$; where P0(i,j) Is The Value of P(i,j) Which Maximizes K(0), And P1(i,j) is The Value of P(i,j) Which Maximizes K(1)." The function of instruction 228 falls under the concept of maximizing the a posteriori probability discussed above with respect to equations (16) & (18). Equation K(q) essentially calculates the probability for a particular connection of a G site to a P site to a D site in the OES graph. The most likely value of the P site is determined for the case where q is "0" and q is "1".

Next, flag S(i,j) is read, 230 "S(i,j)=1?" If "no", then the value of the function is added to total probability variables t0 and t1, respectively, 232 "$t0(i)=t0(i)\times K(0)$, $t1(i)=t1(i)\times K(1)$." Variables t0 and t1 comprise the total probability for part of the graph, i.e., for those D sites not multiply connected. Assuming flag S(i,j) is set, then the D site is multiply connected and its probability value is added to variable x0, x1, respectively, which is representative of the probability of the particular situation, 234 "$x0=x0\times K(0)$, $x1=x1\times K(1)$." Instruction 234 in essence requires the updating of variables x0 and x1. Next, a new table entry is selected, 236 "j=j+1," and inquiry is made whether the new table entry value exceeds the actual number of table values M, 238 "j≦M(i)?" Assuming that the expression is satisfied, the processor branches back to inquiry 208 of FIG. 12a.

Once all D sites have been considered, a determination is made whether the most likely configuration for the associated G site is "0", (i.e., not present), or "1", (i.e., present), 240 "x0≦x1?" If "no", then the G site associated with the subject D site is assumed to be "0", 244 "G(i)=0," while if "yes", the gas is assumed to be present in the chamber and the associated G site is initially assigned a value "1", 242 "G(i)=1." This completes initialization for the particular D site and the routine simply directs updating for the next table entry value, 246 "i=i+1," after which processing branches back to instruction 204 of FIG. 12a, i.e., assuming that inquiry 248 is satisfied, 248 "i≦N?" If not, then all gases have been initialized and the initialization routine ceases, 250 "Stop."

With initialization values, selective stochastic relaxation (i.e., instruction 158 of FIG. 11) can be more efficiently performed. One embodiment for selective stochastic relaxation pursuant to the present invention is set forth in FIGS. 13a & 13b.

Figure 13A:
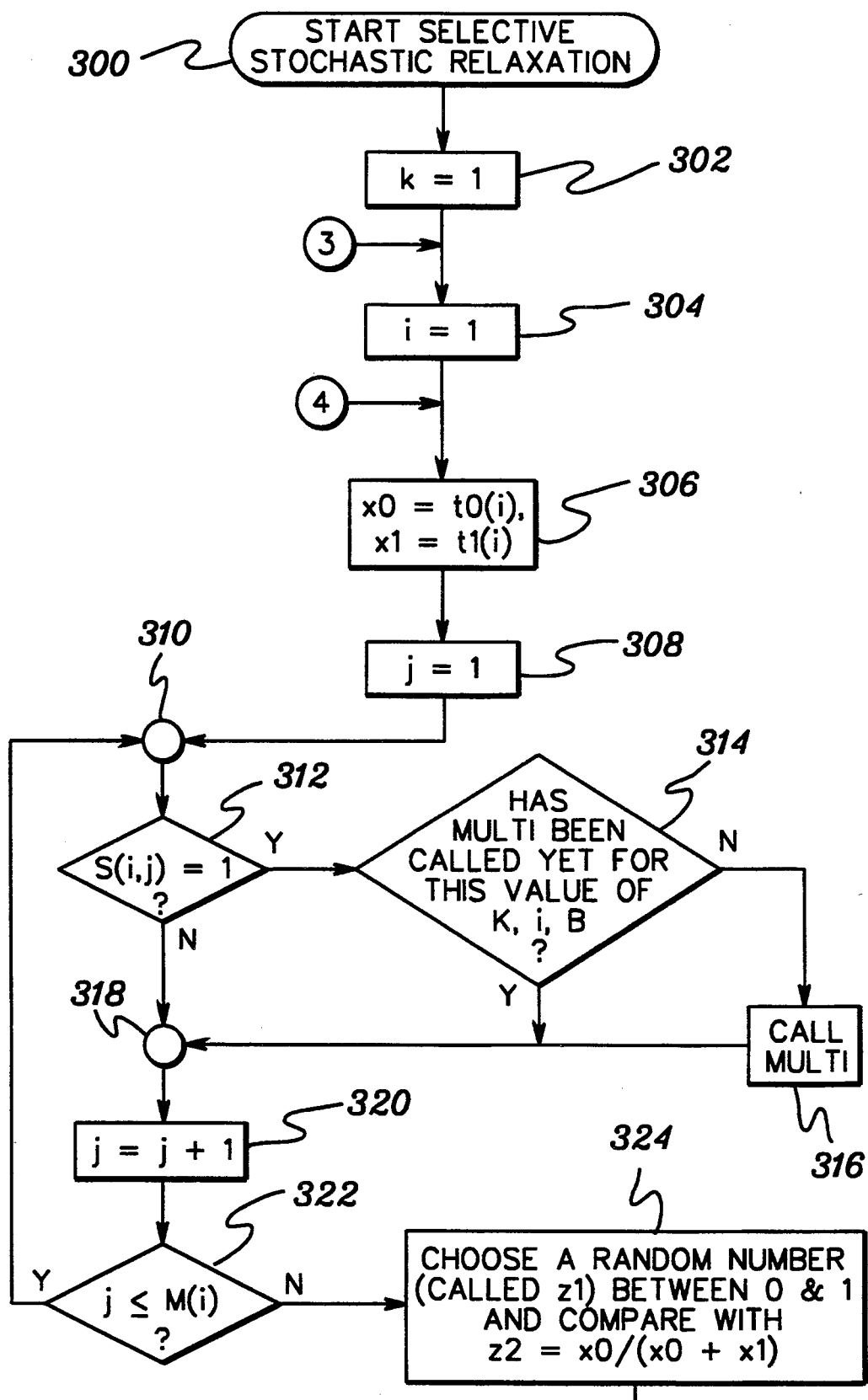
FIGS. 13a & 13b are connected flowcharts of one embodiment of the perform selective stochastic relaxation step of FIG. 11.

Referring first to FIG. 13a, selective stochastic relaxation begins, 300 "Start Selective Stochastic Relaxation," by setting variable k=1, 302 "k=1." Selective stochastic relaxation attempts to determine of all of the possibilities, which G site value is best. (The variable "k" is used as an iterative throughout the selective stochastic relaxation processing.) Pursuant to the selective relaxation technique, each G site in the graph is visited repetitively, with "k" tracking the number of times a particular G site has been visited. The variable "i" is also assigned 1, 304 "i=1" and variables x0 and x1 are initialized to values t0(i), t1(i), respectively, 306 "x0=t0(i), x1=t1(i)." Values t0(i) and t1(i) are the probabilities associated with the non-multiply connected D sites, which are simply stored into x0 or x1.

The first table entry value is selected, 308 "j=1," and after passing through junction 310 inquiry is made whether flag S(i,j) is set for this D site, 312 "S(i,j)=1?" If multiply connected, then inquiry is made whether the subroutine "Multi" has been called, 314 "Has Multi Been Called Yet for this Value of K,i,B?" If "no", then subroutine Multi is called, 316 "Call Multi." This processing functions as a filter to ensure that subroutine Multi is called only once for a particular B site. One Multi subroutine processing approach is set forth below.

Multi (1) Let B designate the B site connected to d(i,j).
(2) Let d(1),d(2), . . . ,d(m) designate all of the D sites which connect to site B with corresponding P sites p(1) , . . . ,p(m).
(3) Set G(i)=0.
(4) Find the values of d(1), . . . ,d(m) and p(1), . . . ,p(m)

$$P[d(1)|p(1)] \times P[p(1)|G\{1\}] \times P[G\{1\}] \times \ldots \times$$
$$P[d(m)|p(m)] \times P[p(m)|G\{m\}] \times P[G\{m\}]$$

subject to $\frac{[(d(1) \times f(1)) + \ldots + (d(m) \times f(m))]}{[f(1) + \ldots + f(m)]}$ where G{i} indicates the G site connected to p(i) and f(i) is as defined in equation (14) above.
(5) Set x0=x0×K0.
(6) Set G(i)=1.
(7) Find the values of d(1), . . . ,d(m) and p(1), . . . ,p(m) which maximize $$K1 = P[d(1)|p(1)] \times P[p(1)|G\{1\}] \times P[G\{1\}] \times \ldots \times$$
$$P[d(m)|p(m)] \times P[p(m)|G\{m\}] \times P[G\{m\}]$$

subject to $\frac{[(d(1) \times f(1)) + \ldots + (d(m) \times f(m))]}{[f(1) + \ldots + f(m)]}$ (8) Set x1=x1×K1.
(9) Return to calling routine.

Figure 14:
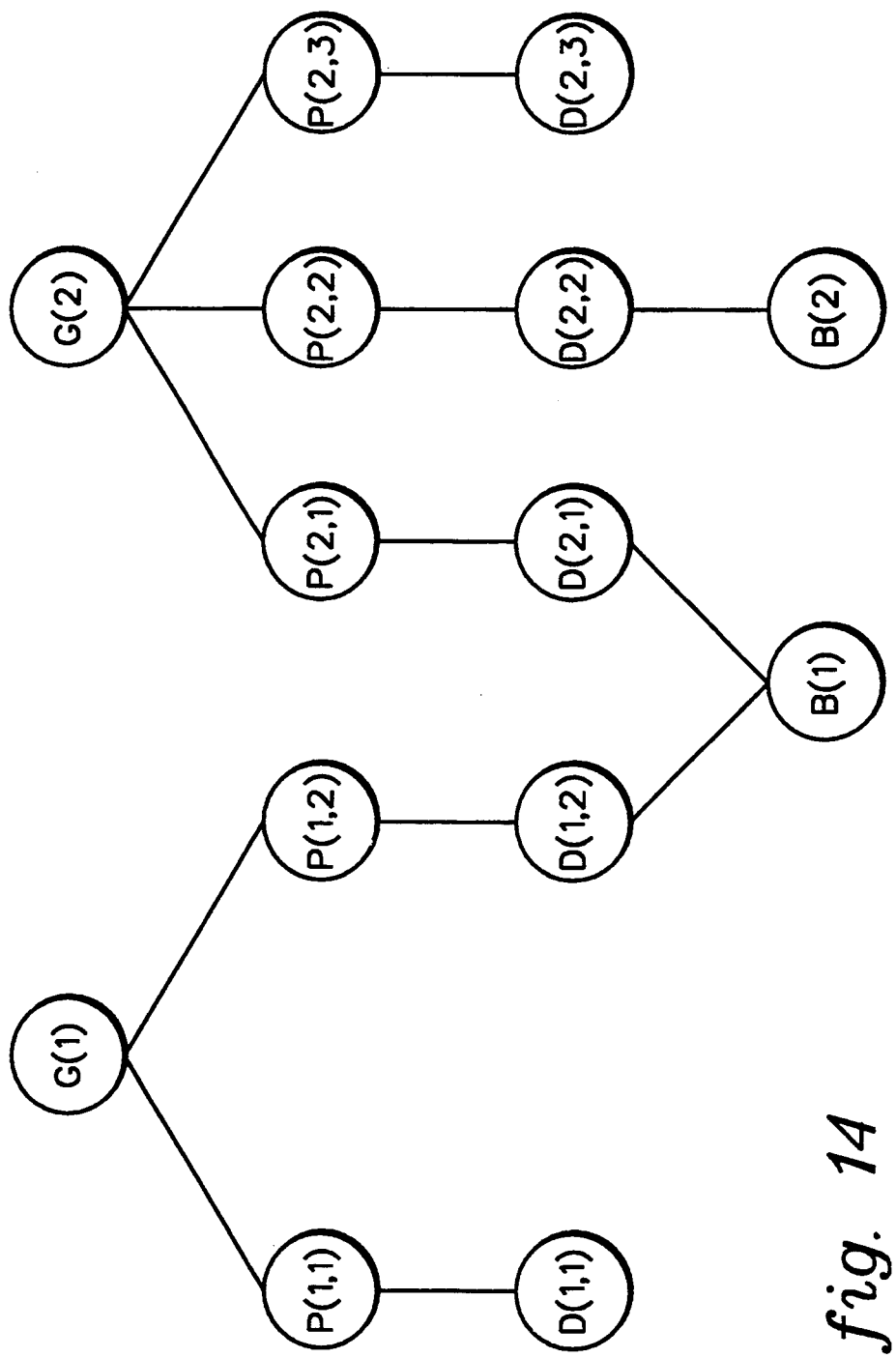
FIG. 14 is a diagram of a connector structure useful in describing the selective stochastic relation method of FIGS. 13a & 13b pursuant to the present invention.

As shown in FIG. 14, two D sites, D(1,2), D(2,1), are connected to a measured B site, B(1). "Multi" processing attempts to determine whether it is more likely that the measured B site is in fact representative of gas G(1), G(2) or both gases G(1) and G(2). (Again, the Multi processing approach presented above is set forth by way of example only. )

Continuing with FIG. 13a, after Multi has been once executed the next table entry value is selected, 320 "j=j+1," and inquiry is made whether all table entry values have been processed, 322 "j≦M(i)?" Once all table entry values have been considered, a G site value, 0 or 1, is chosen. In this processing routine, however, a random number must be chosen and G(0) must be set to 0 or 1 depending upon what the random number is. The random number is chosen from a distribution based on x0 and x1, 324 "Choose a Random Number (Called z1) Between 0 & 1 and Compare With z2=x0/(x0+x1)." The ratio x0/(x0+x1) is really the probability that G(i) is equal to 0. (The selection of a random number for G(i) defines the processing technique as stochastic.)

Figure 13B:
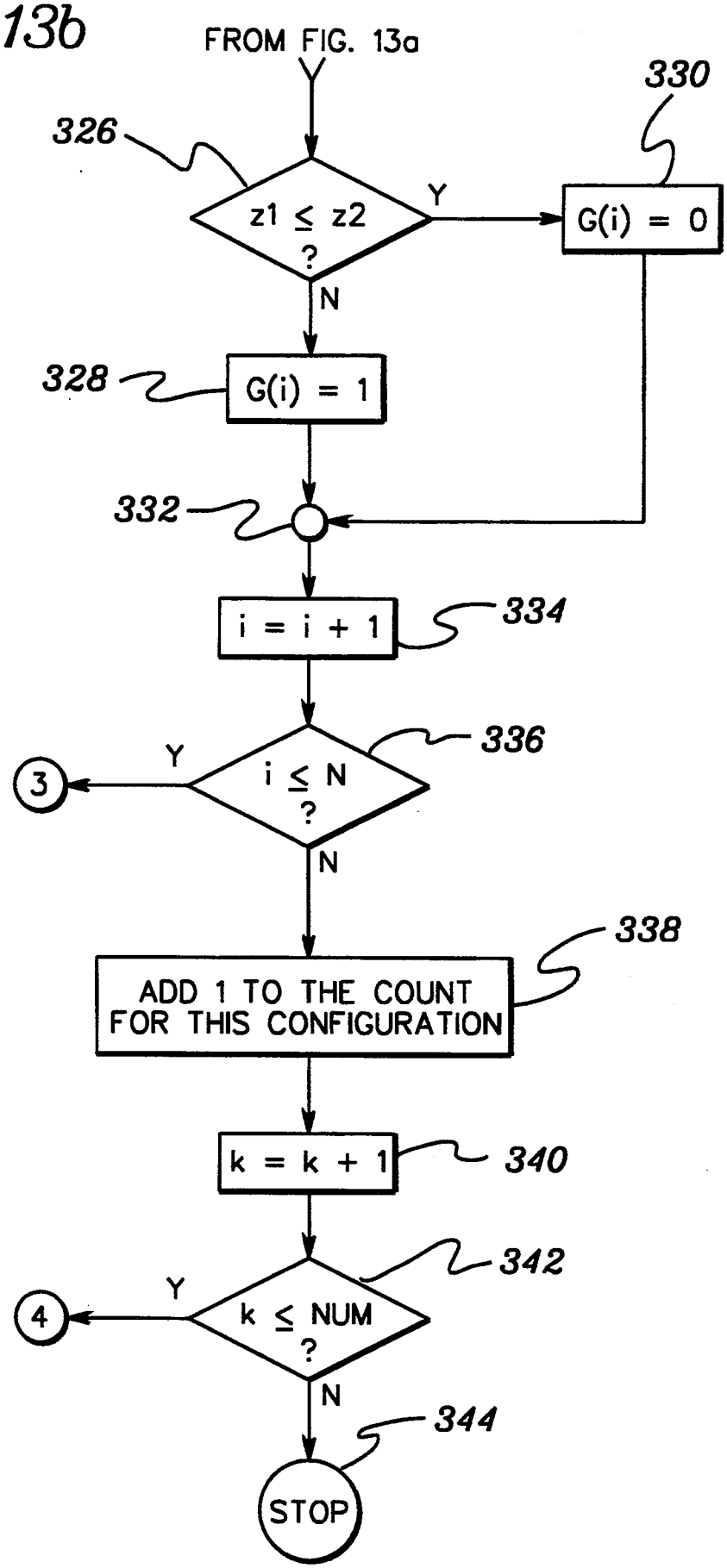

From instruction 324 see FIG. 13b), inquiry is made whether variable z1 is less than or equal to variable z2, 326 "z1≦z2?" The G site value G(i) is then updated based on this comparison. If inquiry 326 is "yes", then G(i) is assigned the value 0, 330 "G(i)=0," while if the inquiry is "no", the value 1 is assigned, 328 "G(i)=1." Processing passes through junction 332 and updates "i" which means that the next gas is to be examined, 334 "i=i+1." But first inquiry 336 "i≦N?" must be satisfied If "yes", processing branches back to instruction 304 for another pass through the routine. Once all gases have been considered (i.e., the answer to inquiry 336 is "no") then one is added to the count for the subject configuration, 338 "Add 1 to the Count for This Configuration." A "no" answer to inquiry 336 means that every G site in the model has been visited and updated according to the random number processing and inquiry is made as to which gases are present. Instruction 338 essentially means that another unique configuration has been added and is now to be considered. The variable k is updated, 340 "k=k+1," and inquiry is made whether the preselected number of iterations have been completed, 342 "k≦NUM?". If the inquiry is satisfied, processing loops back to instruction 306. Once all iterations have been completed processing ceases, 344 "Stop," thereby completing the gas identification algorithm.

Returning to FIG. 9, the next algorithm to be executed comprises the gas monitor routine of step 112. Any one of numerous monitor routines can be constructed by one skilled in the art. For example, for each gas contained in the most frequently occurring configuration, the heights of the peaks associated with the gas change during plasma processing can be compared against a template. This template would comprise predefined acceptable limits for each gaseous species and would be constructed from past experience with similar processes. Statistical confidence bounds can be determined from analyzing variations in past experience processing. If the peak heights change in accordance with the template (i.e., remain within the confidence bounds), then the gas concentrations can be characterized as changing properly.

Figure 15:
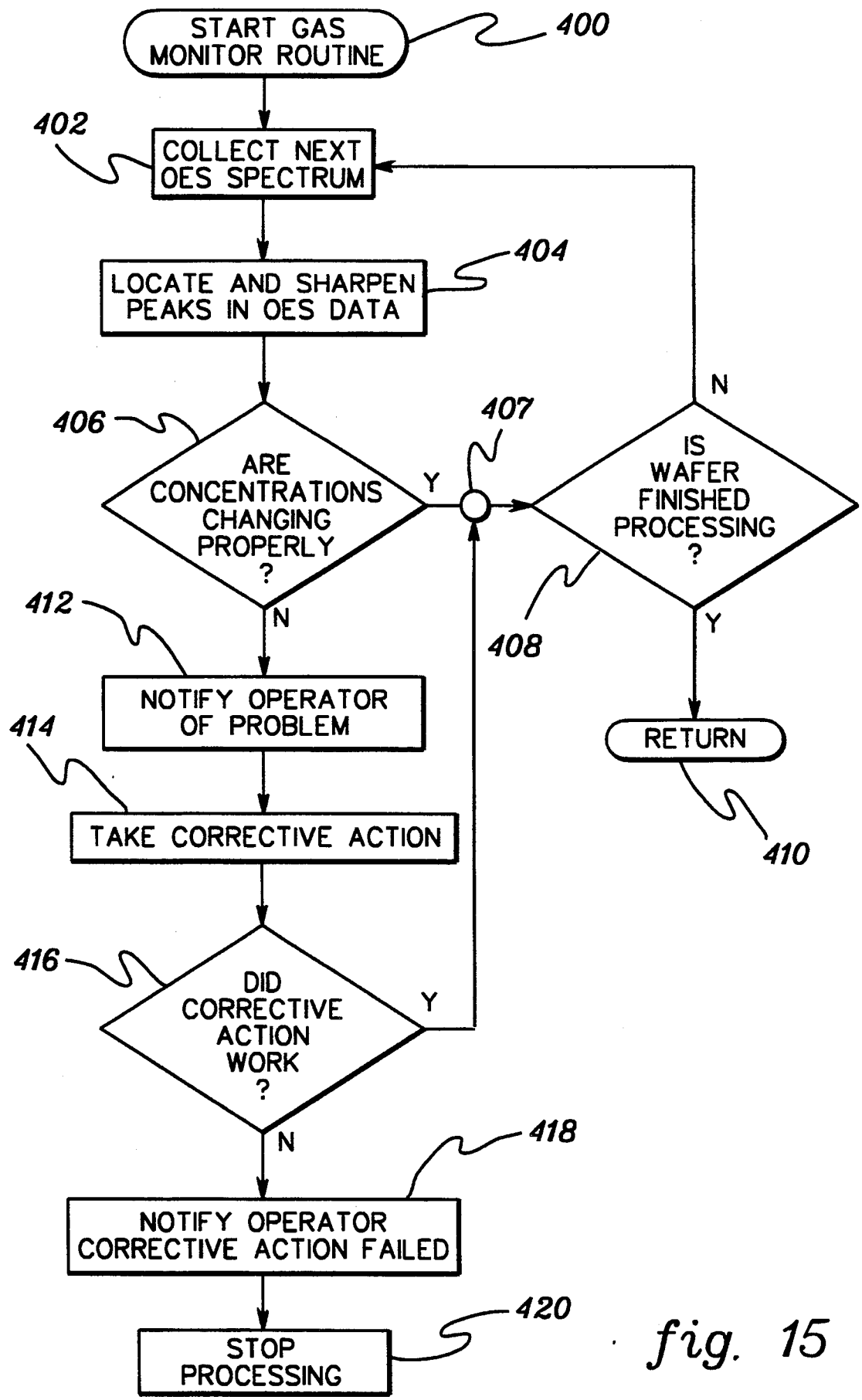
FIG. 15 is a flowchart of one embodiment of the perform gas monitoring routine step of FIG. 9.

One embodiment of a gas monitor routine is set forth in FIG. 15. When the monitor has been initiated, 400 "Start Gas Monitor Routine," and the next OES data has been collected, 402 "Collect Next OES Data," each peak in the OES data is located and sharpened, 404 "Locate and Sharpen Peaks in OES Data," as described above in connection with FIG. 10.

Inquiry is then made whether gas concentrations are changing properly, 406 "Are Concentrations Changing Properly?" If "yes", then the processor determines whether the present wafer has finished processing, 408 "Is Wafer Finished Processing?" If the wafer is completed, then return is made to the processing of FIG. 9 for consideration of the next wafer (instruction 114). If "no", then the processor is directed to collect a next OES spectrum 402. Once in the monitor routine, the processor continues to loop through instructions 402, 404 and inquiries 406 and 408 (i.e., assuming gas concentrations are properly changing) until the subject wafer has finished processing. If concentration levels are outside predefined limits, then error correction is initiated from inquiry 406. Specifically, a system operator may be notified, 412 "Notify Operator of Problem," and automated action is taken to correct the problem, 414 "Take Corrective Action." This automated feedback control is preferably initiated by adjusting one of a plurality of adjustable inputs at the fabrication chamber, such as a mass flow controller, radio frequency power input or chamber pressure adjustment mechanism.

Thereafter, inquiry is made whether or not the corrective action has accomplished the desired effect, i.e., whether the physical process occurring within the fabrication chamber has been brought back to a non-error status, 416 "Did Corrective Action Work?" If "yes", then the processor next inquiries whether the present wafer has finished processing (inquiry 408). If not, then another OES spectrum is collected. Should the corrective action have failed, then a system operator is notified, 418 "Notify Operator Corrective Action Failed," and processing is discontinued, 420 "Stop Processing." If desired, multiple corrective action loops bring the physical process back within anticipated limits could serially be considered to before concluding that processing must be interrupted.

It will be recognized from the description provided above, that a novel closed loop method and system for monitoring and controlling semiconductor processing within a fabrication chamber have been provided. The method and system are fully automated and utilize real-time statistical analysis of sensed data representative of gaseous species (and their concentration levels) present in the fabrication chamber at a given point in time. Optical emission spectrometer data readings from within the fabrication chamber are statistically analyzed using a novel pattern model approach based on Markov random fields and a selective stochastic relaxation analysis to identify gaseous species within the chamber, and their gas concentration levels. The technique is fully objective (being totally automated) and allows for real-time control of the physical process occurring within the chamber. The monitor and control approach ensures process uniformity, and thereby improves product quality. Although described with respect to OES data, the algorithms presented are applicable to other types of spectroscopic devices as well.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. An automated method for operating a semiconductor manufacturing apparatus within predefined or derived limits, said apparatus having a fabrication chamber with at least one of a flow rate controllable gaseous species inlet, an adjustable radio frequency powering means and a pressure adjustment mechanism, said automated method comprising the steps of:
   (a) producing a plasma process within said fabrication chamber of said semiconductor manufacturing apparatus;
   (b) simultaneous with said step (a), collecting from within said chamber wavelength and relative intensity data on a plurality of different electromagnetic wavelengths simultaneously occurring therein;
   (c) determining the location of at least some intensity peaks for the simultaneously occurring plurality of different electromagnetic wavelengths from said wavelength and relative intensity data;
   (d) utilizing said wavelength data collected in step (b) and said intensity peak location information determined in step (c) to identify using a Markov random field model at least one gaseous species contained within said chamber during said plasma processing; and
   (e) regulating in an automated manner said plasma process of step (a) to ensure operation of semiconductor manufacturing apparatus within said predefined or derived limits, said regulating being based on information determined in said steps (b)–(d), said regulating step including automatically regulating said plasma process of step (a) through control of one of said at least one flow rate controllable gaseous species inlet, said adjustable radio frequency powering means and said pressure adjustment mechanism associated with said fabrication chamber.

2. The automated method of claim 1, wherein said steps (b)–(e) are accomplished in real-time.

3. The automated method of claim 1, further comprising the step of utilizing said wavelength and relative intensity data collected in said step (b) and said peak location information determined in said step (c) to determine in an automated manner the relative concentration level of each gaseous species identified in said step (d), and wherein said automated regulating step (e) includes regulating processing of said semiconductor manufacturing apparatus using said information determined in said steps (b)–(d) and said determined, relative gas concentration levels.

4. The automated method of claim 1, wherein said wavelength and relative intensity data collecting of step (b) includes collecting said wavelength and relative intensity data occurring within the chamber utilizing optical emission spectroscopy.

5. The automated method of claim 4, wherein said wavelength and relative intensity data comprises optical emission spectroscopic data, and wherein said spectroscopic data collecting of step (b) includes sensing at a plurality of optical sensors said wavelength and relative intensity data occurring within said chamber, each of said plurality of optical sensors being dedicated to a particular wavelength.

6. The automated method of claim 1, wherein said identifying step (d) includes referencing a predefined look-up table containing known wavelength location information for various gaseous species to compare said wavelength and relative intensity data with said known wavelength location information and thereby identify said at least one gaseous species contained within said chamber.

7. The automated method of claim 1, wherein said Markov random field model is pre-established based on Markov random fields for a plurality of preselected possible gaseous species within said fabrication chamber and wherein said identifying step (d) includes solving said Markov random field based model for said at least one gaseous species contained within said chamber using a maximization algorithm.

8. The automated method of claim 7, wherein said maximization algorithm comprises selective stochastic relaxation.

9. The automated method of claim 1, wherein said plasma processing of step (a) continues for a predefined interval, and wherein said method further comprises the step of periodically repeating steps (b)–(e) during said predefined interval.

10. The automated method of claim 1, wherein said peak locating step (c) further comprises sharpening at least some of said intensity peak location information determined in said step (c) prior to said gaseous species identifying step (d).

11. The automated method of claim 10, wherein said intensity peak sharpening includes employing an extrapolation procedure to refine the wavelength and relative intensity data collected in said step (b).

12. A closed loop method for monitoring and controlling a plasma process, said method comprising the steps of:
- (a) providing a plasma processing system having a fabrication chamber with at least one electronically adjustable control for regulating plasma processing within said chamber;
- (b) establishing a plasma process within said fabrication chamber;
- (c) simultaneous with said step (b), collecting an electromagnetic wavelength spectra from said plasma process occurring within said fabrication chamber, said collected spectra comprising wavelength and relative intensity data;
- (d) determining an intensity peak location for each of at least some of said different electromagnetic wavelengths in said wavelength data;
- (e) utilizing said wavelength and relative intensity data of step (c) and said peak location information of step (d) to identify using a Markov random field model at least one vaporized species contained within said chamber; and
- (f) regulating in an automated manner said plasma processing of step (b) based on said wavelength and relative intensity data, peak location information and vaporized species information of said steps (c)–(e), respectively, said plasma process regulating including producing an electronic signal to automatically regulate said at least one adjustable control associated with said fabrication chamber, and thereby regulate said plasma processing occurring therein.

13. The monitoring and control method of claim 12, wherein said plasma process of step (b) is established for a predefined fabrication interval, and wherein said method further comprises periodically repeating said steps (c)–(f) during said predefined fabrication interval.

14. The monitoring and control method of claim 13, wherein predefined or derived limits for said plasma processing within said fabrication chamber are established, and wherein said method further comprises terminating plasma processing within said chamber whenever said regulating step (f) fails to bring said plasma processing within said predefined or derived limits through said automatic regulating of said at least one adjustable process control.

15. The monitoring and control method of claim 12, wherein said steps (c)–(f) are accomplished in real time.

16. The monitoring and control method of claim 12, wherein said step (c) and said step (d) include utilizing optical emission spectroscopy to collect said electromagnetic wavelength spectra and to determine said peak wavelength location information, respectively.

17. The monitoring and control method of claim 12, wherein said Markov random field model is pre-established for the collected wavelength spectra based on a predetermined table of vaporized species, and wherein said identifying step (e) further includes solving said Markov random field model for said predefined plurality of vaporized species using selective stochastic relaxation analysis.

18. The monitoring and control method of claim 12, wherein said providing step (a) includes providing a plasma processing system including a fabrication chamber having multiple electronically adjustable controls for regulating plasma processing within said chamber, and wherein said regulating step (f) includes producing an electronic signal to regulate each of said multiple adjustable controls pursuant to at least some of said wavelength and relative intensity data, peak location information, and vaporized species information of said steps (c)–(e), respectively.

19. The monitoring and control method of claim 12, further comprising the step of sharpening at least some of said intensity peak location information determined in said step (d) prior to said vaporized species identifying step (e).

20. The monitoring and control method of claim 19, wherein said peak sharpening includes employing an extrapolation procedure to refine wavelength and intensity data collected in said step (c).

21. A closed loop method for operating a semiconductor fabrication chamber within predefined or derived constraints, said fabrication chamber having at least one electronically adjustable mechanism for controlling processing therein, said operating method comprising the steps of:
- (a) establishing a plasma process within said fabrication chamber;
- (b) simultaneous with said step (a), collecting multivariate data indicative of gaseous species occurring in said plasma process established in step (a) within said chamber, said multivariate data being collected through at least one sensor associated with said fabrication chamber;
- (c) using said collected multivariate data of step (b) to identify in real-time using a Markov random field model a gaseous species contained within said chamber, and its relative concentration level; and
- (d) automatically regulating said plasma process within said fabrication chamber in real-time based on said identified gaseous species and its determined relative concentration level of said step (c), said regulating step including producing an electronic signal to adjust said at least one adjustable mechanism based upon the multivariate data collected and the relative concentration information determined in said steps (b) and (c), respectively, whenever plasma processing exceeds said predefined or derived constraints, said adjusting being such as to bring said plasma process within said predefined or derived constraints.

22. The closed loop method of claim 21, wherein said plasma process of step (a) is for a predefined interval, and wherein said method further comprises the step of periodically repeating steps (b)–(d) during said predefined interval.

23. The closed loop method of claim 21, wherein said collecting step (b) includes utilizing a spectrometer in association with said fabrication chamber to collect said multivariate data.

24. The closed loop method of claim 21, wherein said Markov random field model is pre-established for a plurality of preselected potential gaseous species, and said identifying step (c) includes solving said Markov random field based model using a maximization algorithm to determine the identity of at least some of a plurality of gaseous species within said chamber.

25. The closed loop method of claim 24, wherein said maximization algorithm utilized in said step (c) comprises a selective stochastic relaxation algorithm.

26. The closed loop method of claim 21, wherein said multivariate data collecting step (b) includes:

collecting from within the fabrication chamber wavelength and relative intensity data on a plurality of different electromagnetic wavelengths simultaneously occurring therein; and wherein said gaseous species identifying step (c) includes:

determining the location of at least some intensity peaks for the simultaneously occurring plurality of different electromagnetic wavelengths from said wavelengths and relative intensity data;

sharpening at least some of said located intensity peaks; and identifying in real time using said Markov random field model a gaseous species contained within said chamber employing the sharpened intensity peaks.

27. The closed loop method of claim 26, wherein said sharpening of at least some of said located intensity peaks includes employing an extrapolation procedure to refine the wavelength and relative intensity data of each located intensity peak.

28. An automated method for operating and controlling within predefined or derived limits a plasma processing system having a fabrication chamber with at least one electronically adjustable, primary plasma process control point, said automated method comprising the steps of:

(a) producing a plasma process within said fabrication chamber;

(b) collecting optical emission spectra data on said plasma process occurring within said fabrication chamber;

(c) locating intensity peaks in said optical emission spectra data;

(d) electronically identifying using a Markov random field model gaseous species contained within said chamber during said plasma processing based on said optical emission spectra data of step (b);

(e) determining whether any incorrect gaseous species is identified in said step (d) for said plasma process of step (a); and (f) whenever said step (e) identifies an incorrect gaseous species, regulating in an automated manner said plasma processing by producing an electronic control signal to adjust said primary process control point to move said plasma processing of step (a) within said predefined or derived limits.

29. The automated method of claim 28, further comprising the step of sharpening at least some of said located intensity peaks in said optical emission spectroscopy data prior to said gaseous species identifying step (d).

30. The automated method of claim 28, further comprising the steps of:

determining relative concentration levels for selected ones of said identified gaseous species of step (d);

evaluating whether said determined concentration levels are within predetermined acceptable ranges; and regulating in an automated manner said plasma processing of step (a) whenever said concentration levels are outside said predetermined acceptable ranges by producing an electronic control signal to adjust said primary process control point to move the gases occurring within said plasma processing of step (a) within said predetermined acceptable ranges.

31. A closed loop system for manufacturing a semiconductor, said closed loop system comprising:

semiconductor manufacturing apparatus including a fabrication chamber and apparatus for generating a plasma process therein;

at least one electronically adjustable mechanism for controlling plasma processing within said fabrication chamber;

means, associated with said fabrication chamber, for collecting an electromagnetic wavelength spectra from within said fabrication chamber while plasma processing is occurring therein, said collected spectra comprising wavelength and relative intensity data;

means for determining an intensity peak location for at least some of the different electromagnetic wavelengths represented by said wavelength data;

processor means coupled to said collecting means and said determining means for automatically identifying using a Markov random field model at least one vaporized species contained within said chamber during plasma processing using said wavelength and relative intensity data and said intensity peak location information; and real-time feedback control means responsive to said processor means for regulating within predetermined limits said plasma processing occurring within said fabrication chamber based on said wavelength and relative intensity data, located peak information and identified vaporized species, said feedback control means being coupled to said at least one electronically adjustable mechanism and including means for electronically adjusting said at least one adjustable mechanism to maintain said plasma processing occurring within said fabrication chamber within said predetermined limits.

32. The closed loop method of claim 31, wherein said means for collecting an electromagnetic wavelength spectra includes an optical emission spectrometer coupled to said fabrication chamber.

33. The closed loop method of claim 31, further comprising means for sharpening the electromagnetic wavelength of each located intensity peak, said sharpening means being coupled to provide sharpened peak location information to said processor means.

34. An automated method for operating within predefined or derived limits a plasma processing system having a fabrication chamber with at least one electronically adjustable, primary plasma process control point, comprising the steps of:

(a) producing a plasma process within the fabrication chamber;

(b) simultaneous with said step (a), collecting optical emission spectra data on said plasma process produced within the fabrication chamber;

(c) locating intensity peaks in said optical emission spectra data collected in said step (b);

(d) sharpening at least some of said located intensity peaks of said step (c); and (e) electronically identifying at least one gaseous species contained within the fabrication chamber during said plasma processing using said intensity peaks sharpened in said step (d).

35. The automated method of claim 34, wherein said intensity peak sharpening of said step (d) includes employing for each located intensity peak an extrapolation procedure to refine the corresponding optical emission spectra data collected in said step (b).

36. The automated method of claim 35, wherein said employing of said extrapolation procedure includes for each located intensity peak fitting a regression line to measured data on each side of the located intensity peak and substituting wavelength and intensity data of a point where the two regression lines intersect for corresponding optical emission spectra data collected in said step (b).

37. The automated method of claim 34, wherein said locating of intensity peaks of said step (c) includes reordering optical emission spectra data collected in said step (b) so that the data is arranged in descending order of intensity and wherein said step (c) further includes grouping the collected optical emission spectra data such that each intensity peak is defined by a group of collected optical emission spectra data.

38. The automated method of claim 34, wherein said electronically identifying step (e) includes employing a Markov random field model to identify the at least one gaseous species contained within the fabrication chamber during the plasma processing.

39. The automated method of claim 34, further comprising the step of regulating in an automated manner said plasma process of said step (a) by producing an electronic control signal to adjust said primary process control point to move said plasma process of said step (a) to within the predefined or derived limits.

40. A method for identifying at least one gaseous species present in a process, said method comprising the steps of:
  (a) generating wavelength and relative intensity data from the process using an optical emissions spectrometer;
  (b) providing a Markov random field model correlating wavelength and relative intensity data with particular gaseous species; and
  (c) electronically identifying at least one gaseous species contained within the process by employing the Markov random field model of step (b) and the generated wavelength and relative intensity data of step (a).

* * * * *

UNITED STATES PATENT AND TRADEMARK OFFICE
CERTIFICATE OF CORRECTION

PATENT NO. : 5,347,460
DATED : Sept. 13, 1994
INVENTOR(S) : Gifford et al.

It is certified that error appears in the above-indentified patent and that said Letters Patent is hereby corrected as shown below:

Delete equation (19) as shown in column 17, lines 22-27 and insert the following equation as follows:

$$\Phi(G_1, \cdots, G_N) = \frac{1}{Z} \prod_{j \in \pi_i \cup \Omega_i} f[D_j|p_j] \times P[p_j|G_{(j)}] \times \prod_{G \in N_{(i)}} P[G] \times \prod_{j \notin \pi_i \cup \Omega_i} f[D_j|p_j] \times P[p_j|G_{(j)}] \times \prod_{G \notin N_{(i)}} P[G] \quad (19)$$

Signed and Sealed this

Thirteenth Day of December, 1994

BRUCE LEHMAN

Attest:

Attesting Officer    Commissioner of Patents and Trademarks